US008952682B2

(12) United States Patent
Mahan et al.

(10) Patent No.: US 8,952,682 B2
(45) Date of Patent: Feb. 10, 2015

(54) SYSTEM AND METHOD FOR CALIBRATING A MAGNETOMETER WITH VISUAL AFFORDANCE

(75) Inventors: Laura Mahan, Kanata (CA); Jeffrey Charles Bos, Waterloo (CA); Przemyslaw Abratowski, Milton (CA); Christopher Harris Snow, Kitchener (CA); Steve Robert Grenier, Georgetown (CA); Nazih Almalki, Waterloo (CA)

(73) Assignee: BlackBerry Limited, Waterloo (CA)

( * ) Notice: Subject to any disclaimer, the term of this patent is extended or adjusted under 35 U.S.C. 154(b) by 621 days.

(21) Appl. No.: 13/218,562

(22) Filed: Aug. 26, 2011

(65) Prior Publication Data
US 2012/0206129 A1    Aug. 16, 2012

Related U.S. Application Data

(60) Provisional application No. 61/441,883, filed on Feb. 11, 2011.

(51) Int. Cl.
G01R 35/00    (2006.01)
G01C 17/38    (2006.01)
G01R 33/00    (2006.01)

(52) U.S. Cl.
CPC ............ G01C 17/38 (2013.01); G01R 33/0017 (2013.01); G01R 33/0023 (2013.01)
USPC .................. 324/202; 702/92; 33/356; 463/37

(58) Field of Classification Search
USPC ....................................................... 324/202
See application file for complete search history.

(56) References Cited

U.S. PATENT DOCUMENTS

| 6,877,237 | B1 | 4/2005 | Withanawasam |
| 7,613,581 | B2 | 11/2009 | Skvortsov et al. |
| 2006/0031014 | A1* | 2/2006 | Sato et al. ..................... 701/224 |
| 2009/0231425 | A1 | 9/2009 | Zalewski |
| 2010/0105475 | A1 | 4/2010 | Mikhailov et al. |
| 2010/0220064 | A1 | 9/2010 | Griffin et al. |

OTHER PUBLICATIONS

Anand Shimpi, "Understanding the iPhone 3Gs", Jul. 7, 2009, anandtech, www.anandtech.com/show/2798/14.*
Office Action; Canadian Application No. 2,750,975; Oct. 1, 2013.
Daniel Griscom, SeisMaCalibrate, http://www.suitable.com/tools/seismacalibrate.html, Date unknown.
Author unknown, G-Sensor Calibration Toolv1.00, http://www.freewarepocketpc.net/ppc-download-g-sensor-calibration-tool.html, Sep 27, 2008.

(Continued)

Primary Examiner — Melissa Koval
Assistant Examiner — Stephen G Armstrong
(74) Attorney, Agent, or Firm — Ridout and Maybee LLP

(57) ABSTRACT

A method and system are provided for calibrating a magnetometer of a mobile device. The method comprises displaying a visual indication of a gestural path on a display of the portable electronic device, monitoring for changes in orientation of the portable electronic device, changing the visual indication in response to the monitored changes in the orientation of the portable electronic device, measuring a magnetic field with the magnetometer, and calibrating the magnetometer in accordance with measurements of the magnetic field acquired at different points along the gestural path.

20 Claims, 22 Drawing Sheets

(56) References Cited

OTHER PUBLICATIONS

Author unknown, 3D Tilt calibration, http://forums.toucharcade.com/archive/index.php/t-5500.html, Feb. 20, 2009.

Author unknown, iPhone and iPad: Calibrating Compass; www.support.apple.com/kb/TS2767, Jan. 17, 2011.

Precision in Motion—Kionix—Handheld Electronic Compass Applications Using the Kionix KXM52 MEMS Tri-Axis Accelerometer; Oct. 1, 2004.

Author unknown; Nokia N97 Support; http://europe.nokia.com/support/product-support/n97/how-to/maps/use-maps; May 5, 2011.

Author unknown; How to: Calibrate Nokia N97's compass within three seconds; http://symbianworld.org/1654-how-to-calibrate-nokia-n97s-compass-within-three-seconds; May 5, 2011.

Author unknown; Nokia E72—My Nokia E72; Free Compass Application; http://mynokiae72.com/2010/02/02/free-compass-application/.

Suunto: "EN Suunto X6 Suunto X6M User's Guide", Mar. 1, 2007, XP055144333, Retrieved from the Internet URL:http://ns.suunto.com/Manuals/X6_X6M/Userguides/ X6 X6M userguide_EN.pdf [retrieved on Oct. 3, 2013].

Suunto: "Suunto X6/X6HR/S6—How to calibrate the compass", Jul. 12, 2012, XP054975550, Retrieved from the Internet: URL:https://www.youtube.com/watch?v=le_VGKXLF38 [retrieved on Oct. 13, 2014].

\* cited by examiner

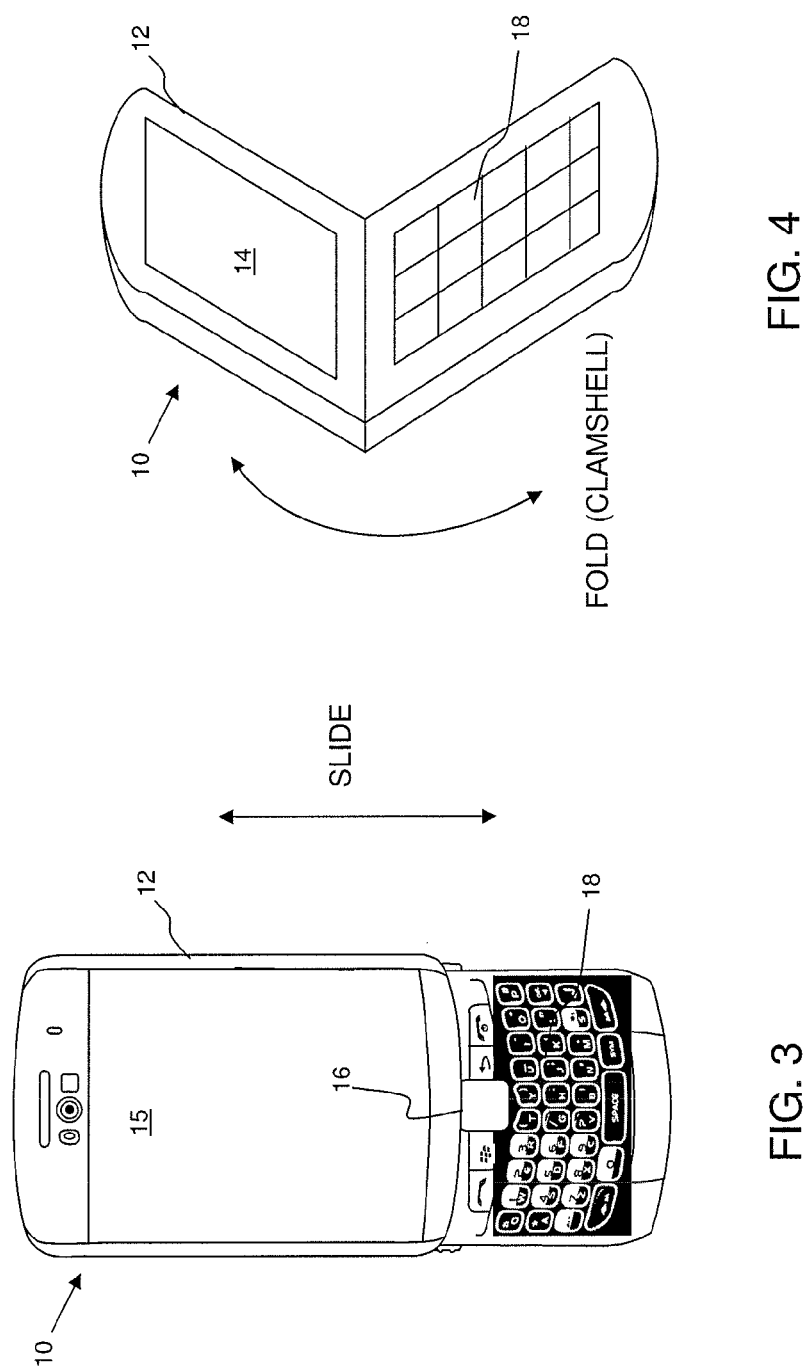

SYSTEM AND METHOD FOR CALIBRATING A MAGNETOMETER WITH VISUAL AFFORDANCE

RELATED APPLICATION DATA

The present application claims priority to, and the benefit of, provisional U.S. patent application Ser. No. 61/441,883, filed Feb. 11, 2011, which is incorporated herein by reference in its entirety.

TECHNICAL FIELD

The present application relates to magnetometers, and more particularly to a system and method for calibrating a magnetometer with visual affordance.

BACKGROUND

A magnetometer is an instrument used to measure the strength and/or direction of the magnetic field in the vicinity of the instrument. Many electronic devices exist that utilize a magnetometer for taking measurements for a particular application, e.g. metal detectors, geophysical instruments, aerospace equipment, and portable electronic devices such as cellular telephones, personal digital assistants (PDAs), smartphones and tablet computers.

Electronic devices that comprise a magnetometer and have a display and processing capabilities, such as a smart phone, may include a compass application for showing direction on the display.

Portable electronic devices, such as those listed above, can operate in many different locations and under various circumstances. Changes in the environment in which the device operates can affect the operation of the magnetometer. As such, the magnetometer may need to be calibrated at certain times.

BRIEF DESCRIPTION OF THE DRAWINGS

Embodiments will now be described by way of example only with reference to the appended drawings wherein:

FIG. 3 is a perspective view of an example mobile device comprising a slidable keyboard assembly.

FIG. 4 is a perspective view of an example mobile device comprising a clam-shell type foldable housing.

DETAILED DESCRIPTION OF EXAMPLE EMBODIMENTS

Figure 2:
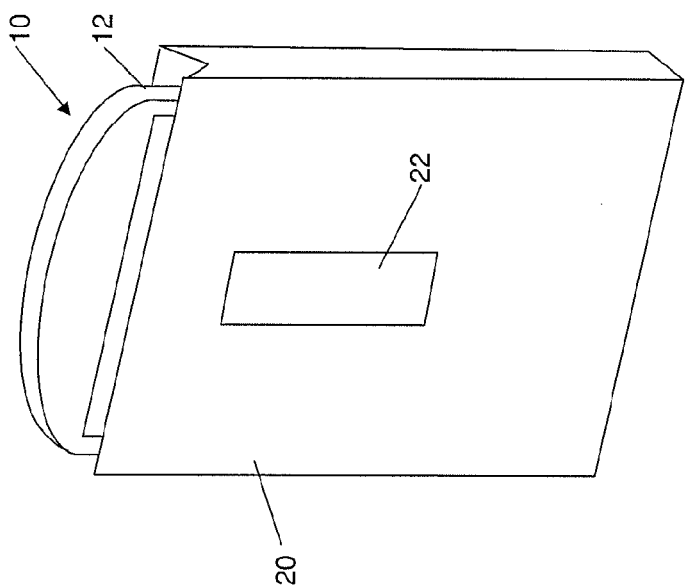
FIG. 2 is a perspective view of an example mobile device while holstered.

It has been found that to accommodate changing environments, electronic devices which utilize a magnetometer can perform ongoing calibration methods. Such calibration methods can be automatically triggered (e.g. periodic calibrations) or triggered by an application or external event or change of state of the device.

The present disclosure provides a method for calibrating a magnetometer of a portable electronic device with visual affordance. A visual cue to a gestural path defined by a series of device orientations (or positions) is provided. Moving the portable electronic device along the gestural path and measuring the magnetic field at different points along the gestural path provides a suitable range of data for calibrating the magnetometer.

In accordance with one example embodiment, there is provided a method of calibrating a magnetometer of a portable electronic device, the method comprising: displaying a visual indication of a gestural path on a display of the portable electronic device; monitoring for changes in orientation of the portable electronic device; changing the visual indication in response to the monitored changes in the orientation of the portable electronic device; measuring a magnetic field with the magnetometer; and calibrating the magnetometer in accordance with measurements of the magnetic field acquired at different points along the gestural path.

In accordance with another example embodiment, there is provided a method of calibrating a magnetometer of a portable electronic device, the method comprising: moving the portable electronic device along a predetermined gestural path; measuring a magnetic field with the magnetometer; and calibrating the magnetometer in accordance with measurements of the magnetic field acquired at different points along the gestural path. In some examples, the gestural path represents a plurality of orientations of the portable electronic device, wherein the magnetic field is measured in at least some of the plurality of orientations of the gestural path. In some examples, the magnetic field is measured at all of the plurality of orientations of the gestural path. In some examples, the plurality of orientations of the gestural path correspond to a series of gestures in the orientation of the portable electronic device, wherein the series of gestures includes a tilt left, tilt up, tilt down and tilt right. In some examples, the calibrating is performed when a threshold number of measurements of the magnetic field at predetermined orientations of the portable electronic device have been measured.

In some examples, the calibrating comprises performing a calibration operation to obtain one or more calibration parameters and storing the obtained calibration parameters. In some examples, the method further comprises measuring the magnetic field with the magnetometer and adjusting the measurements of magnetic field in accordance with the stored calibration parameters.

In accordance with a further example embodiment, there is provided a portable electronic device, comprising: a processor; a magnetometer coupled to the processor; a display coupled to the processor; wherein the processor is configured for performing the method(s) set forth herein.

In accordance with a further embodiment, there is provided a computer program product comprising a computer readable medium having stored thereon computer program instructions for implementing a method on an electronic device, the computer executable instructions comprising instructions for performing the method(s) set forth herein.

Reference will now be made to the accompanying drawings which show, by way of example, example embodiments of the present disclosure. For simplicity and clarity of illustration, reference numerals may be repeated among the Figures to indicate corresponding or analogous elements. Numerous details are set forth to provide an understanding of the example embodiments described herein. The example embodiments may be practiced without these details. In other instances, well-known methods, procedures, and components have not been described in detail to avoid obscuring the example embodiments described. The description is not to be considered as limited to the scope of the example embodiments described herein. Any reference to direction or orientation herein is for convenience and is not intended to be limiting unless explicitly stated herein.

The present disclosure generally relates to a portable electronic device such as a handheld electronic device or tablet device. The principles may equally be applied to other devices such as on personal computers capable of running applications, embedded computing devices, other electronic devices, and the like. The portable electronic device may be a mobile (e.g., wireless) communication device or an electronic device without communication capabilities. For clarity in the discussion below, mobile communication devices are commonly referred to as "mobile devices" for brevity. Examples of applicable mobile devices include without limitation, cellular phones, cellular smart-phones, wireless organizers, pagers, personal digital assistants, computers, laptops, handheld wireless communication devices, wirelessly enabled notebook computers, portable gaming devices, tablet computers, or any other portable electronic device with processing and communication capabilities.

Figure 1:
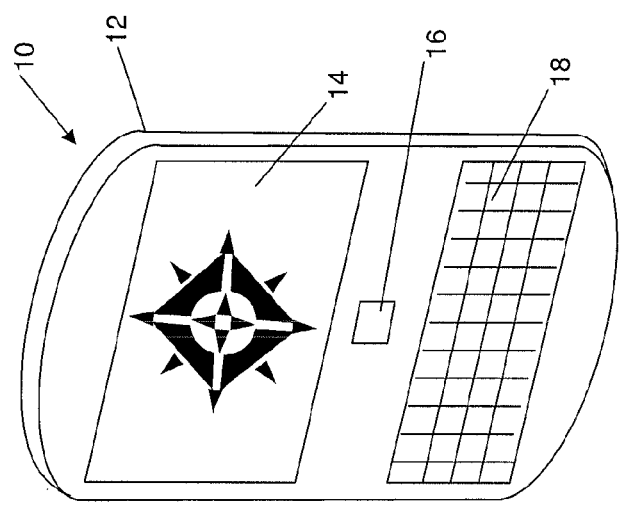
FIG. 1 is a perspective view of an example mobile device displaying an electronic compass.

An exterior view of an example mobile device 10 is shown in FIG. 1. The mobile device 10 in this example comprises a housing 12 which supports a display 14, a positioning device 16 (e.g. track pad, track wheel, etc.), and a keyboard 18. The keyboard 18 may comprise a full-Qwerty (as shown) set of keys but may also provide a reduced Qwerty set of keys (not shown) in other embodiments. FIG. 2 illustrates a complementary holster 20 for the mobile device 10. The holster 20 is typically used to stow and protect the outer surfaces of the housing 12, display 14, positioning device 16, keyboard 18, etc. and may be used to trigger other features such as a notification profile, backlight, phone, etc. In this example, the holster 20 comprises a clip 22 to facilitate supporting the holster 20 and thus the mobile device 10 on a belt or other object.

It can be appreciated that the mobile device 10 shown in FIGS. 1 and 2 is provided as an example for illustrative purposes only. For example, FIG. 3 illustrates another mobile device 10, which comprises a touchscreen display 15 and a "slide-out" keyboard 18. In operation, the touchscreen display 15 can be used to interact with applications on the mobile device 10 and the keyboard 18 may be slid out from behind the touchscreen display 15 as shown, when desired, e.g. for typing or composing an email, editing a document, etc. FIG. 4 illustrates yet another example embodiment of a mobile device 10, wherein the housing 12 provides a foldable or flippable, clamshell type mechanism to fold the display 14 towards the keyboard 18 to effectively transition the mobile device 10 between an operable or open state and a standby or closed state. It can be appreciated that the clamshell type housing 12 as shown in FIG. 4 can be used to trigger an "answer" operation when changing from the closed state to the open state and, conversely, can trigger an "end" operation when changing from the open state to the closed state.

The holstered state shown in FIG. 2 and the slide and folded states shown in FIGS. 3 and 4 illustrate that the mobile device 10 may assume various states depending on the type of device and its various features. As will be discussed below in greater detail, it has been recognized that magnetic effects can change or be otherwise influenced by the state of the mobile device 10, in particular where magnetic members (e.g. magnets) are used to detect or trigger a change in the operation of the mobile device 10 due to a change in configuration thereof. Since changing magnetic influences can affect a magnetometer and its accuracy, it has been found that changes in state of the mobile device 10 can be used to trigger a calibration of the magnetometer in order to compensate for any degradation of the accuracy of the magnetometer due to the magnetic influences.

Figure 5:
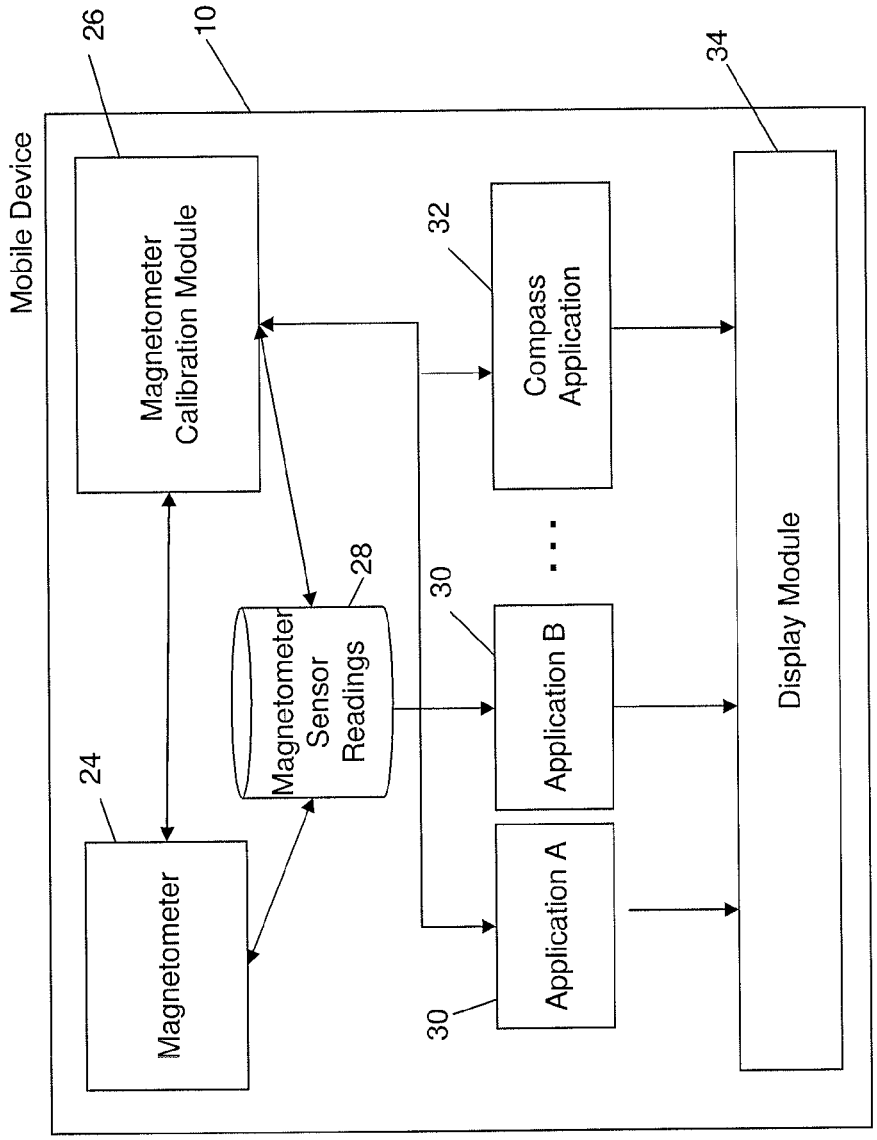
FIG. 5 is a block diagram of an example configuration for a mobile device comprising a magnetometer calibration module.

An example configuration for a mobile device 10 comprising a magnetometer 24 is shown in FIG. 5. The magnetometer 24, when operable, obtains or otherwise acquires readings including the direction of the magnetic field and its strength. Such readings are stored in a magnetometer sensor readings data store 28. Various applications 30 may utilize the readings in the data store 28. In this example, a compass application 32 is shown specifically. It can be appreciated that the other applications 30 may include any application that can make use of magnetometer readings, for example, a stud finder application, metal detector application, augmented reality based application, etc. The applications 30, 32 may then use such readings to provide a user interface (UI) using a display module 34, e.g. a real-time compass showing the mobile device's heading as shown in FIG. 1. It can be appreciated that various components of the mobile device 10 are omitted from FIG. 5 for ease of illustration.

Figure 6:
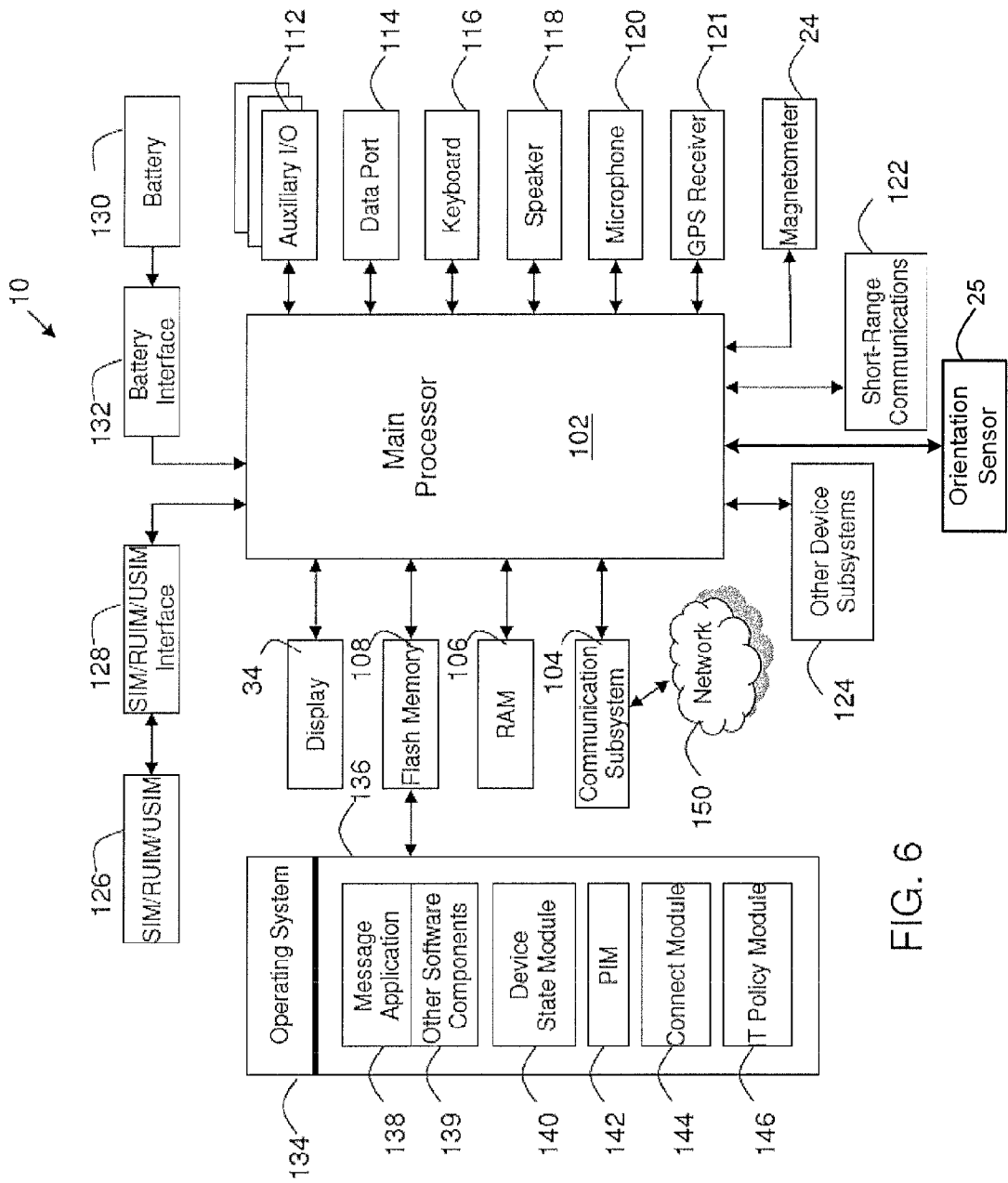
FIG. 6 is a block diagram of an example configuration for a mobile device.

Referring now to FIG. 6, shown therein is a block diagram of an example embodiment of a mobile device 10, which provides further detail thereof. The mobile device 10 comprises a number of components such as a main processor 102 that controls the overall operation of the mobile device 10. Communication functions, including data and voice communications, are performed through a communication subsystem 104. The communication subsystem 104 receives messages from and sends messages to a wireless network 150. In this example embodiment of the mobile device 10, the communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by 3G and 4G networks such as EDGE, UMTS and HSDPA, LTE, Wi-Max etc. New standards are still being defined, but it is believed that the new standards will have similarities to the network behaviour described herein, and it will also be understood by persons skilled in the art that the embodiments described herein are intended to use any other suitable standards that are developed in the future. The wireless link connecting the communication subsystem 104 with the wireless network 150 represents one or more different Radio Frequency (RF) channels, operating according to defined protocols specified for GSM/GPRS communications. With newer network protocols, these channels are capable of supporting both circuit switched voice communications and packet switched data communications.

The main processor 102 also interacts with additional subsystems such as a Random Access Memory (RAM) 106, a flash memory 108, a display 34, an auxiliary input/output (I/O) subsystem 112, a data port 114, a keyboard 116, a speaker 118, a microphone 120, GPS receiver 121, magnetometer 24, orientation sensor 25, short-range communications 122, and other device subsystems 124.

The orientation sensor 25 is controlled by one or a combination of a monitoring circuit and operating software. The orientation sensor 25 may be, for example, an accelerometer or a gyroscope. In some examples, the orientation sensor 25 is a three-axis accelerometer having three mutual orthogonally sensing axes. The accelerometer may be utilized to detect acceleration of the mobile device 10, such as a direction of gravitational forces or gravity-induced reaction forces. The accelerometer has a sensing element (not shown) which detects acceleration from motion and/or gravity. The accelerometer generates and outputs an electrical signal representative of the detected acceleration. Changes in movement of the mobile device 10 result in changes in acceleration which produce corresponding changes in its electrical signal output. The acceleration measured by the accelerometer can be translated into an orientation of the mobile device 10 using equations such as those known in the art.

Figure 25C:
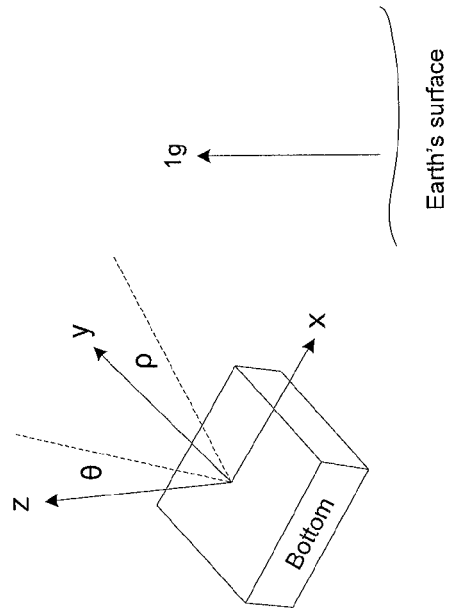
FIG. 25A to 25C are schematic diagrams illustrating the assignment of pitch and roll vectors of a three-axis orientation sensor in accordance with an example embodiment of the present disclosure.
Figure 25B:
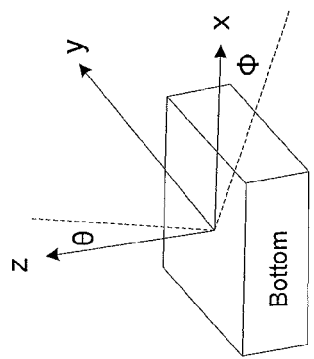
Figure 25A:
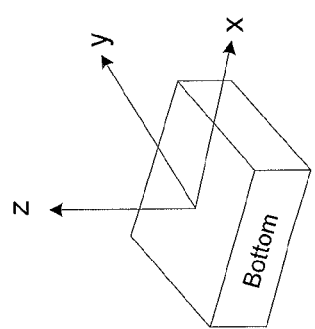

Referring now to FIGS. 25A to 25C, the assignment of pitch and roll vectors of a three-axis accelerometer in accordance with an example embodiment of the present disclosure will be described. The accelerometer has three sensing axes denoted "x", "y" and "z". The x-axis and y-axis are aligned with a horizontal plane defined by the mobile device 10. The z-axis is perpendicular to the horizontal plane of the mobile device 10. The z-axis will detect when mobile device 10 is moved vertically.

Figure 26A:
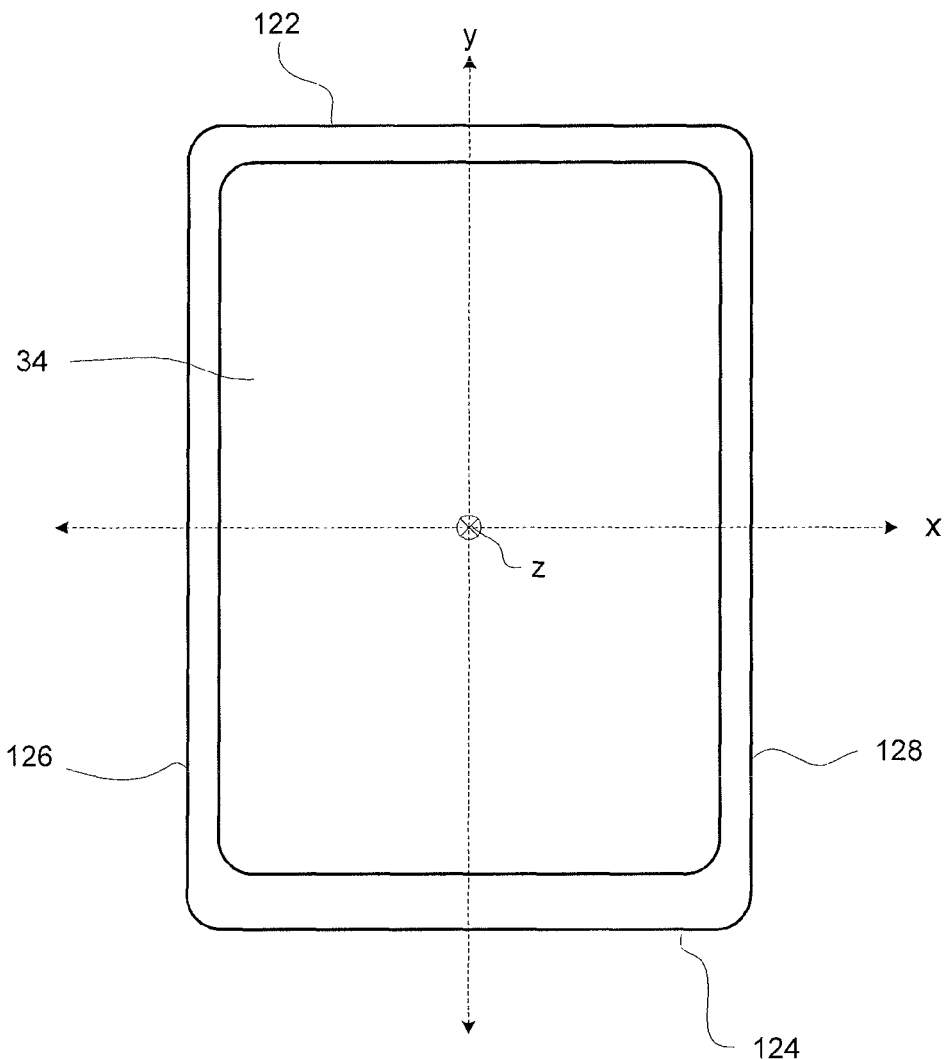
FIG. 26A is a front view of a mobile device showing sensing axes of a accelerometer in accordance with one embodiment of the present disclosure.
Figure 26B:
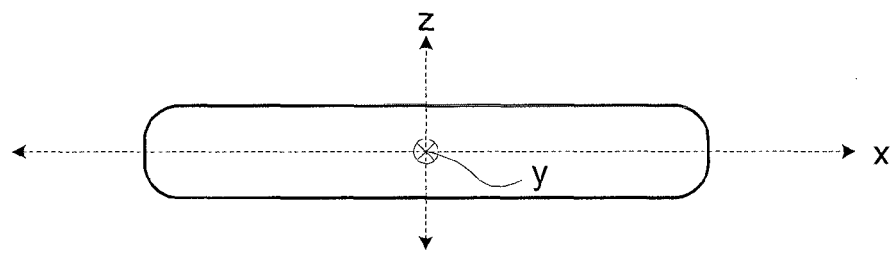
FIG. 26B is a top view of the mobile device of FIG. 26A.

Referring to FIG. 26A and 26B, the alignment of the "x", "y" and "z" axes of the accelerometer with axes of the mobile device 10 in accordance with one embodiment of the present disclosure is shown. The x-axis is aligned about an axis extending laterally along the midpoint of the mobile device 10 between the top and bottom 122, 124 respectively. The y-axis is aligned about an axis extending longitudinally along the midpoint of the mobile device 10 between the left and right sides 126, 128 respectively. The z-axis extends perpendicularly through the x-y plane defined by the x and y axes at the intersection (origin) of these axes. It is contemplated that the "x", "y" and "z" axes may be aligned with different features of the mobile device 10 in other embodiments.

As shown in FIG. 25A, if the mobile device 10 is positioned horizontal (level with the ground), the z-axis measures 1 g in the z-axis. When the mobile device 10 is tilted away from the horizontal, the z-axis baseline reading decreases from 1 g. As shown in FIG. 25B, pitch ($\phi$) is the angle of the x-axis relative to the ground. $\theta$ is the angle of the z-axis relative to gravity. As shown in FIG. 25C, roll ($\rho$) is the angle of the y-axis relative to the ground. It will be appreciated that rotation may occur about any combination of sensing axes. The concepts and methodology described herein can be applied to any orientation and any combination of pitch ($\phi$), roll ($\rho$) angles, and $\theta$ (the angle of the z-axis relative to gravity).

Pitch ($\phi$), roll ($\rho$), the angle of the z-axis relative to gravity ($\theta$) angles of a three-axis accelerometer may be calculated based on unfiltered motion signals (non-AC coupled signal) using the following equations:

$$\varphi = \arctan \frac{x_{accel}}{\sqrt{y_{accel}^2 + z_{accel}^2}}$$

$$\rho = \arctan \frac{y_{accel}}{\sqrt{x_{accel}^2 + z_{accel}^2}}$$

$$\theta = \arctan \frac{\sqrt{x_{accel}^2 + y_{accel}^2}}{z_{accel}}$$

where $x_{accel}$, $y_{accel}$ and $z_{accel}$ are the unfiltered measurements from the x, y and z-axes of the three-axis accelerometer. It will be appreciated that pitch ($\phi$), roll ($\rho$) and angle of the z-axis relative to gravity ($\theta$) can also be calculated by other means.

Some of the subsystems of the mobile device 10 perform communication-related functions, whereas other subsystems may provide "resident" or on-device functions. By way of example, the display 34 and the keyboard 116 may be used for both communication-related functions, such as entering a text message for transmission over the network 150, and device-resident functions such as a calculator or task list.

The mobile device 10 can send and receive communication signals over the wireless network 150 after required network registration or activation procedures have been completed. Network access is associated with a subscriber or user of the mobile device 10. To identify a subscriber, the mobile device 10 may use a subscriber module. Examples of such subscriber modules include a Subscriber Identity Module (SIM) developed for GSM networks, a Removable User Identity Module (RUIM) developed for CDMA networks and a Universal Subscriber Identity Module (USIM) developed for 3G networks such as UMTS. In the example shown, a SIM/RUIM/USIM 126 is to be inserted into a SIM/RUIM/USIM interface 128 in order to communicate with a network. The SIM/RUIM/USIM component 126 is one type of a conventional "smart card" that can be used to identify a subscriber of the mobile device 10 and to personalize the mobile device 10, among other things. Without the component 126, the mobile device 10 may not be fully operational for communication with the wireless network 150. By inserting the SIM/RUIM/USIM 126 into the SIM/RUIM/USIM interface 128, a subscriber can access all subscribed services. Services may include: web browsing and messaging such as e-mail, voice mail, SMS, and MMS. More advanced services may include: point of sale, field service and sales force automation. The SIM/RUIM/USIM 126 includes a processor and memory for storing information. Once the SIM/RUIM/USIM 126 is inserted into the SIM/RUIM/USIM interface 128, the SIM/RUIM/USIM 126 is coupled to the main processor 102. In order to identify the subscriber, the SIM/RUIM/USIM 126 can include some user parameters such as an International Mobile Subscriber Identity (IMSI). An advantage of using the SIM/RUIM/USIM 126 is that a subscriber is not necessarily bound by any single physical mobile device. The SIM/RUIM/USIM 126 may store additional subscriber information for a mobile device as well, including datebook (or calendar) information and recent call information. Alternatively, user identification information can also be programmed into the flash memory 108.

The mobile device 10 is typically a battery-powered device and may include a battery interface 132 for receiving one or more batteries 130 (typically rechargeable). In at least some embodiments, the battery 130 can be a smart battery with an embedded microprocessor. The battery interface 132 is coupled to a regulator (not shown), which assists the battery 130 in providing power V+ to the mobile device 10. Although current technology makes use of a battery, future technologies such as micro fuel cells may provide the power to the mobile device 10.

The mobile device 10 also includes an operating system (OS) 134 and software components 136 to 146. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, may be installed on the mobile device 10 during its manufacture. Other software applications include a message application 138 that can be any suitable software program that allows a user of the mobile device 10 to send and receive electronic messages. Various alternatives exist for the message application 138 as is well known to those skilled in the art. Messages that have been sent or received by the user are typically stored in the flash memory 108 of the mobile device 10 or some other suitable storage element in the mobile device 10. In at least some embodiments, some of the sent and received messages may be stored remotely from the mobile device 10 such as in a data store of an associated host system that the mobile device 10 communicates with.

The software applications can further comprise a device state module 140, a Personal Information Manager (PIM) 142, and other suitable modules (not shown). The device state module 140 provides persistence, i.e. the device state module 140 ensures that important device data is stored in persistent memory, such as the flash memory 108, so that the data is not lost when the mobile device 10 is turned off or loses power.

The PIM 142 includes functionality for organizing and managing data items of interest to the user, such as, but not limited to, e-mail, contacts, calendar events, voice mails, appointments, and task items. A PIM application has the ability to send and receive data items via the wireless network 150. PIM data items may be seamlessly integrated, synchronized, and updated via the wireless network 150 with the mobile device subscriber's corresponding data items stored and/or associated with a host computer system. This functionality creates a mirrored host computer on the mobile device 10 with respect to such items. This can be particularly advantageous when the host computer system is the mobile device subscriber's office computer system.

The mobile device 10 may also comprise a connect module 144, and an IT policy module 146. The connect module 144 implements the communication protocols that are required for the mobile device 10 to communicate with the wireless infrastructure and any host system, such as an enterprise system, that the mobile device 10 is authorized to interface with.

The connect module 144 includes a set of APIs that can be integrated with the mobile device 10 to allow the mobile device 10 to use any number of services associated with the enterprise system. The connect module 144 allows the mobile device 10 to establish an end-to-end secure, authenticated communication pipe with a host system (not shown). A subset of applications for which access is provided by the connect module 144 can be used to pass IT policy commands from the host system to the mobile device 10. This can be done in a wireless or wired manner. These instructions can then be passed to the IT policy module 146 to modify the configuration of the device 10. Alternatively, in some cases, the IT policy update can also be done over a wired connection.

The IT policy module 146 receives IT policy data that encodes the IT policy. The IT policy module 146 then ensures that the IT policy data is authenticated by the mobile device 100. The IT policy data can then be stored in the flash memory 106 in its native form. After the IT policy data is stored, a global notification can be sent by the IT policy module 146 to all of the applications residing on the mobile device 10. Applications for which the IT policy may be applicable then respond by reading the IT policy data to look for IT policy rules that are applicable.

Other types of software applications or components 139 can also be installed on the mobile device 10. These software applications 139 can be pre-installed applications (i.e. other than message application 138) or third party applications, which are added after the manufacture of the mobile device 10. Examples of third party applications include games, calculators, utilities, etc.

The additional applications 139 can be loaded onto the mobile device 10 through at least one of the wireless network 150, the auxiliary I/O subsystem 112, the data port 114, the short-range communications subsystem 122, or any other suitable device subsystem 124. This flexibility in application installation increases the functionality of the mobile device 10 and may provide enhanced on-device functions, communication-related functions, or both. For example, secure communication applications may enable electronic commerce functions and other such financial transactions to be performed using the mobile device 10.

The data port 114 enables a subscriber to set preferences through an external device or software application and extends the capabilities of the mobile device 10 by providing for information or software downloads to the mobile device 10 other than through a wireless communication network. The alternate download path may, for example, be used to load an encryption key onto the mobile device 10 through a direct and thus reliable and trusted connection to provide secure device communication.

The data port 114 can be any suitable port that enables data communication between the mobile device 10 and another computing device. The data port 114 can be a serial or a parallel port. In some instances, the data port 114 can be a USB port that includes data lines for data transfer and a supply line that can provide a charging current to charge the battery 130 of the mobile device 10.

The short-range communications subsystem 122 provides for communication between the mobile device 10 and different systems or devices, without the use of the wireless network 150. For example, the subsystem 122 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download may be processed by the communication subsystem 104 and input to the main processor 102. The main processor 102 may then process the received signal for output to the display 34 or alternatively to the auxiliary I/O subsystem 112. A subscriber may also compose data items, such as e-mail messages, for example, using the keyboard 116 in conjunction with the display 34 and possibly the auxiliary I/O subsystem 112. The auxiliary subsystem 112 may comprise devices such as: a touch screen, mouse, track ball, infrared fingerprint detector, or a roller wheel with dynamic button pressing capability. The keyboard 116 is an alphanumeric keyboard and/or telephone-type keypad. However, other types of keyboards may also be used. A composed item may be transmitted over the wireless network 150 through the communication subsystem 104.

For voice communications, the overall operation of the mobile device 10 in this example is substantially similar, except that the received signals are output to the speaker 118, and signals for transmission are generated by the microphone 120. Alternative voice or audio I/O subsystems, such as a voice message recording subsystem, can also be implemented on the mobile device 10. Although voice or audio signal output is accomplished primarily through the speaker 118, the display 34 can also be used to provide additional information such as the identity of a calling party, duration of a voice call, or other voice call related information.

It will be appreciated that any module or component exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the mobile device 10 (or other computing or communication device that utilizes similar principles) or accessible or connectable thereto. Any application or module herein described may be implemented using computer readable/executable instructions that may be stored or otherwise held by such computer readable media.

Figure 7:
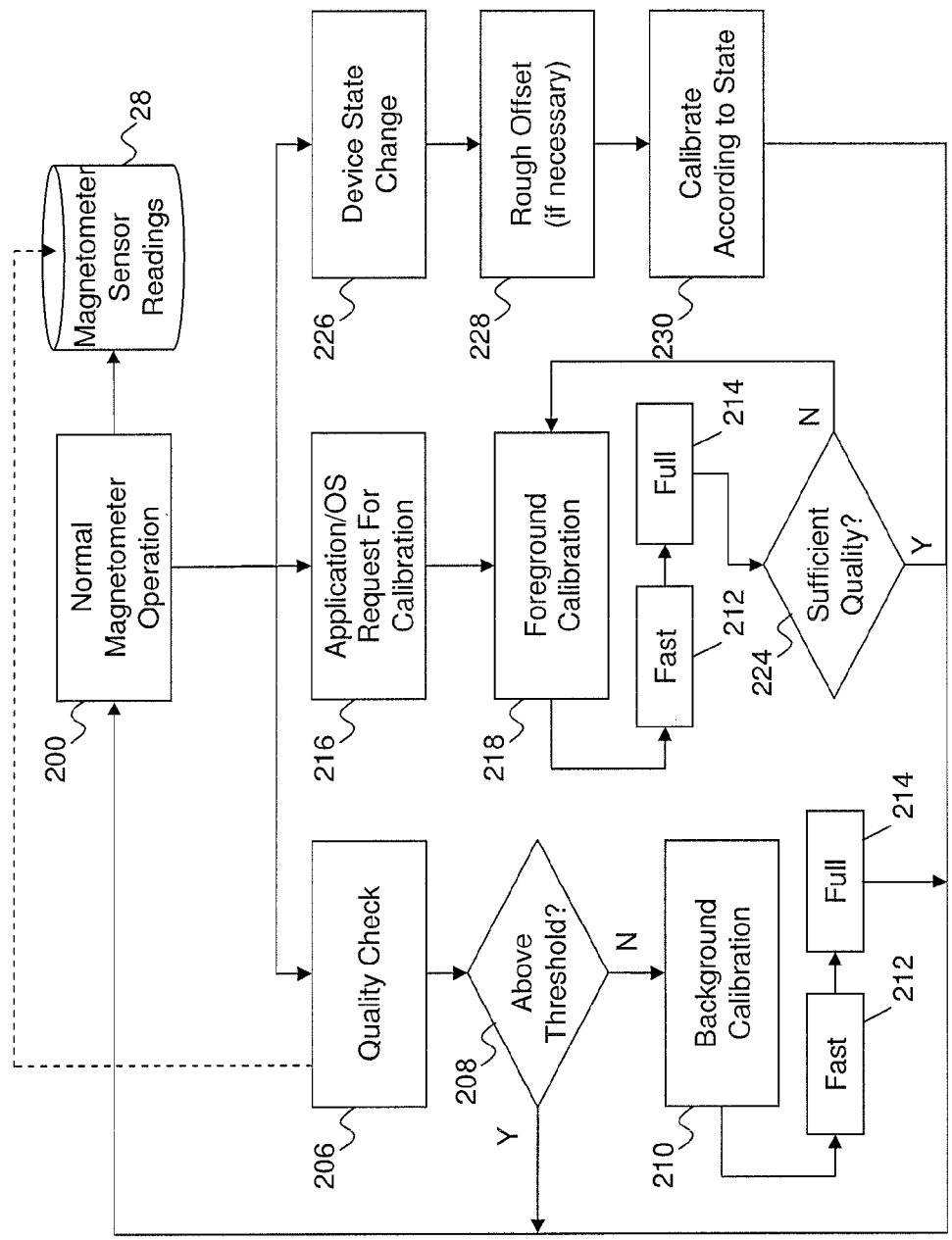
FIG. 7 is a flow chart comprising an example set of computer executable instructions for performing an ongoing calibration of a magnetometer on a mobile device.

FIG. 7 illustrates an example set of computer executable instructions that may be executed by the magnetometer calibration module 26 to perform ongoing calibrations according to the way in which the mobile device 10 is being used (e.g. according to the states shown in FIGS. 2 to 4) and to compensate for changing environments or conditions. At 200, normal magnetometer operation occurs, wherein the magnetometer 24 is operable to take readings and provide such readings to the magnetometer sensor readings data store 28. It can be appreciated that the magnetometer 24 is in an example embodiment a vector type, three-axis magnetometer 24 that is operable to obtain readings along each of its three axes, to measure the component of the magnetic field in a particular direction, relative to the spatial orientation of the magnetometer 24, and thus the mobile device 10. However, the principles discussed below may be at least in part applied to scalar type magnetometers (not shown) in other example embodiments. As noted above, the magnetometer 24 and its readings may be utilized by various applications 30, such as the compass application 32 to provide features incorporating a magnetometer reading. In order to accommodate changing environments and conditions that may affect (e.g. degrade) the quality of the magnetometer readings, e.g. due to the presence of magnetic interference and the like, various calibration processes may be operable to run in the background of what is visible to the user.

The normal magnetometer operation 200 can enter three different branches in this example, depending on certain criteria. A quality check 206 may be performed on a periodic or ongoing basis, regardless of the state of the mobile device 10, i.e. in order to continually assess the quality of measurements taken by the magnetometer 24. As such, the quality check 206 may be operable to continually update the magnetometer sensor readings data store 28 (as shown in dashed lines) so that quality measurements are readily available for performing other calibration operations as will be explained in greater detail below. In order to utilize the quality checks on an ongoing basis, the magnetometer calibration module 26 can compare the perceived quality of one or more magnetometer readings against a quality threshold at 208. If the quality of the one or more readings is above the threshold, i.e. is/are of sufficient quality, the magnetometer calibration module 26 may return to the normal operation 200 until the next quality check is to be performed, a particular number of readings are taken, or until another criterion or trigger causes a different branch to be undertaken. If the readings is/are not of sufficient quality, a background calibration may be performed at 210, which in the examples below utilize both fast and full calibration operations at 212 and 214 respectively. Fast and full calibration operations are described in more detail below. In some cases, quality checks at 206 may be performed often enough that the results of the background calibration at 210 would effectively be evaluated at the next quality check. However, in other cases, the background calibration 210 may rely upon the user moving the mobile device 10 during normal operation 200, which may take some time. As such, quality checks 206 may also be performed while the background calibration 210 is ongoing.

During normal operation 200 a foreground calibration at 218 can also be triggered upon detecting a request for calibration from an application 30 or the OS 134 at 216. It can be appreciated that the request at 216 can be initiated by the application itself or via a user input (e.g. using a menu as discussed below). As will be explained in greater detail below, the foreground calibration at 218 also may utilize the same fast 212 and full 214 calibrations and differs from the background calibration at 210 in that the foreground calibration typically relies on active user engagement in order to move the mobile device 10 in various directions in order to obtain different readings. By initiating the foreground calibration 218 via the request at 216, the application 30 may be attempting to reach a predetermined level of quality, which may or may not correspond to the highest quality. For example, if there are 5 levels of quality and the application 30 only requires a quality level 3, if the quality at the time of making the request 216 is 2, the magnetometer calibration module 26 will determine at 224 that the magnetometer readings are of sufficient quality for that application 30 at that particular time and thus does not need to continue trying to increase the quality through applying foreground calibration 218. In this way, the magnetometer calibration module 26 can operate more efficiently and require less processing power and in some circumstances fewer user interactions in order to achieve the desired quality. As can be seen in FIG. 7, if the quality is not yet sufficient, the foreground calibration 218 may be repeated.

During normal operation 200 calibration operations can also be triggered based on a detected device state change at 226. For example, by placing the mobile device 10 in the holster 20 (as shown in FIG. 2), by sliding out the keyboard 18 (as shown in FIG. 3), or by closing or opening the clamshell (as shown in FIG. 4), the mobile device 10 would change state, wherein different magnetic influences may apply as described in greater detail below. To accommodate these changes in state, the magnetometer calibration module 26 can trigger a rough offset at 228 if necessary, and initiate a calibration 230 that is appropriate for the current state 230. For example, a state change due to holstering a mobile device 10 may require different calibrations than a state change due to sliding out the keyboard 12.

It can therefore be seen that the magnetometer calibration module 26 can utilize the various calibration operations triggered during normal operation 200 to continually attempt to improve the magnetometer readings as well as initiate particular calibration routines based on triggers or changes in environment.

Figure 8:
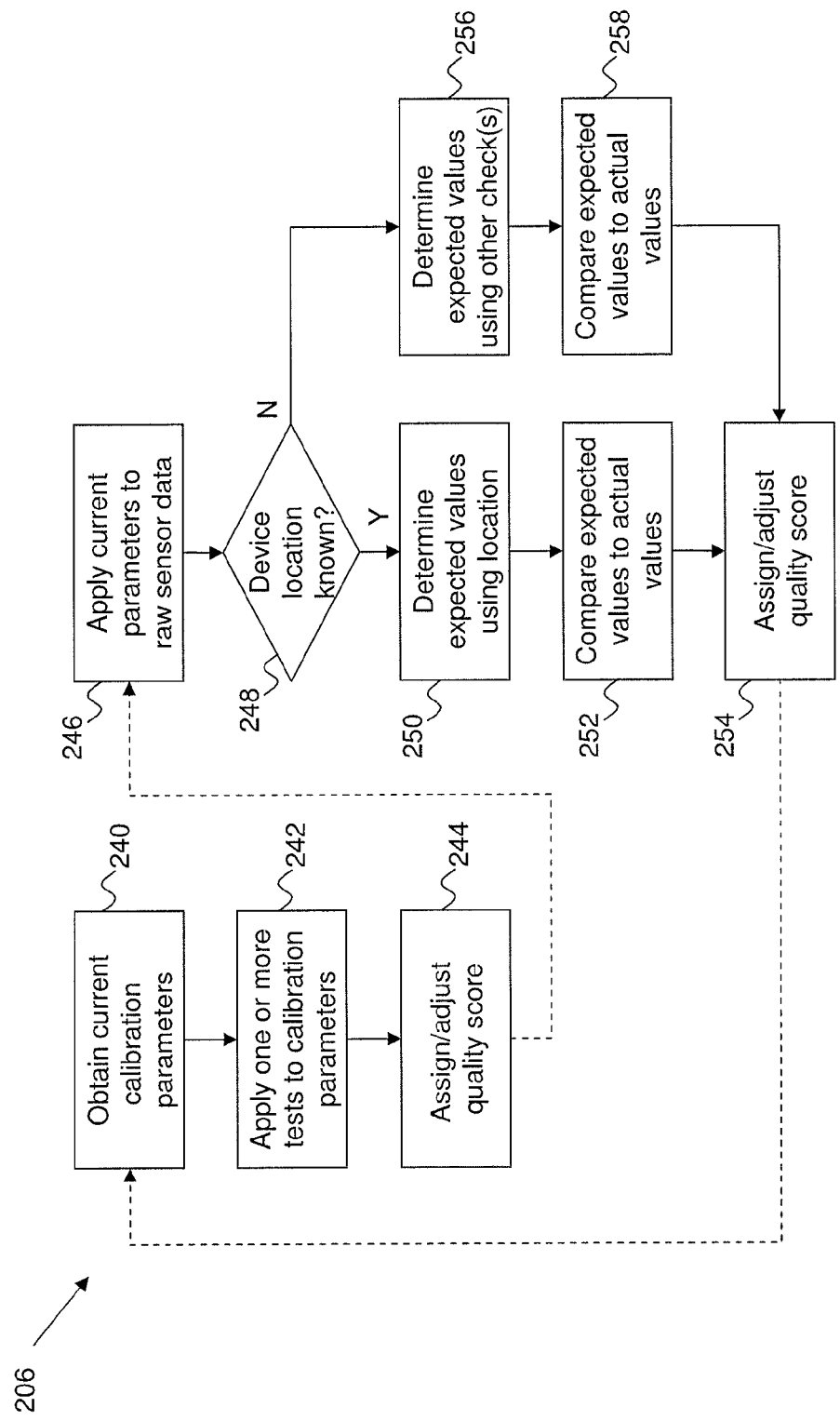
FIG. 8 is a flow chart comprising an example set of computer executable instructions for performing a quality check method.

Turning now to FIG. 8, an example set of computer executable instructions is shown for enabling the magnetometer calibration module 26 to apply quality indicators to magnetometer readings during quality check 206. Such quality indicators provide quality measures that may then be associated with the corresponding magnetometer readings stored in the magnetometer sensor readings data store 28 to enable the magnetometer 24 to provide an indication of quality at the same time that the magnetometer 24 provides the magnetometer reading. By applying the quality indicators, the magnetometer calibration module 26 can detect whether or not a current magnetometer calibration (i.e. due to the last calibration performed on the magnetometer 24) is of good or poor quality.

The quality indicators may be used for the calibration of the three-axis magnetometer 24, which is calibrated using any of the calibration methods described herein, for inaccuracies in gain (which can be different for each axis), DC offset (which can also be different for each axis), and inter-axis misalignment angles. DC offset refers to the steady state bias (i.e. offset) of sensor axes (e.g. 3 values, 1 per sensor axis for a 3-axis magnetometer). The DC offset is the sensor axes' measurement point of intersection origin. The DC offset is usually non-zero as the DC offset typically has a bias due to the net effect of the Hard Iron inside the mobile device 10. As such, a calibration of the magnetometer 24 can be performed to improve the accuracy of three calibration parameters, which may apply to each axis. As discussed below, in some modes of operation, not all calibration parameters may be used. For example, a mobile device 10 may be operated with a gain+DC offset calibration only, or with a DC offset only calibration. As shown in FIG. 8, in this example there are two calibration quality indicator techniques that may be used. Specifically, the first technique includes blocks 240, 242 and 244. The second technique includes blocks 246, 248, 250, 252 and 254 (or blocks 246, 248, 256, 258 and 254 if the result of block 248 is N). It can be appreciated that as illustrated by the dashed lines, both techniques may be used in the same quality analysis and the techniques may be performed before or after each other. The techniques in this example are independent and thus the techniques can be performed separately or together, in either order.

A first technique utilizes indicators based on the value of the calibration parameters, namely the gains, DC offsets, and inter-axis alignment angles that were used in at least the previous calibration that was performed. These types of checks may be performed in order to verify that the gain of each axis is within an allowable range as dictated by the particular magnetometer sensor being used, verify that the difference in gains between any two axes is within an allowable range, verify that the DC offset for each axis is within an allowable range, and/or verify that the inter-axis alignment angle for each pair of axes is within an allowable range. If one or more of these tests fails, this may indicate that the calibration is not accurate and a poor quality rating can be assigned.

It can be appreciated that the above-noted parameters can be determined based on an understanding of the sensors of a particular magnetometer from a particular vendor that is being used. For example, for the "difference in gains" test, a given vendor may guarantee that their device has gains for each axis that are within 10% of each other. As such, it may be known that this is a maximum allowable difference.

For the DC offset, it may be known, for a particular magnetometer of a particular vendor, that the range of values that can be represented (for example, on a particular device, the values may be in the range of −2048 to +2047, or some other range). This range can then be used as a bound on the DC offset test.

Similar principles can also be applied for testing the inter-axis alignment and for the gain.

It may also be noted that experience with particular vendors' magnetometers can be relied upon in order to tighten the ranges. For example, if 100,000 devices are built and it is known that the DC offset is never larger than some known values, then these values can be used in the range checks.

As shown in FIG. 8, in order to perform the first technique, the current calibration parameters can be obtained at 240, one or more of the tests described above applied to the calibration parameters at 242, and a quality score assigned or adjusted at 244.

The second technique shown in FIG. 8 utilizes indicators based on calibrated magnetometer readings, i.e. based on the readings once the current calibration parameters have been applied. Once the raw magnetometer sensor readings have been calibrated at 246 by applying these parameters, various tests can be performed on the calibrated readings. In the example shown in FIG. 8, the magnetometer calibration module 26 determines if the mobile device's location is known at 248, e.g. using GPS data, cell-site geolocation, current timezone, contextual information (e.g. calendar appointment location), or other techniques or data made available to the mobile device 10. If the mobile device's current location is at least roughly known, predetermined data models can be used to determine the expected magnetic field strength, expected inclination, and expected horizontal field intensity for that current location at 250. An example data model includes the World Magnetic Model (WMM). The measured magnetic field strength, inclination, and horizontal field intensity can then be compared to the expected values obtained from the data model at 252. The amount of deviation between the expected and measured values can then be used as an indicator of the quality of the calibration and/or of magnetic anomalies, and thus be used to assign/adjust the quality score at 254.

For example, if the measured radius is close to the expected radius, and the measured inclination is close to the expected inclination, a High quality score can be assigned. If the measured radius is close, but the measured inclination is off (e.g., more than 6 degrees different between expected and measured), a Medium quality score can be assigned. If the measured radius is off, then the quality can be assigned as Low. It can be appreciated that horizontal field intensity can also be used in a similar way to radius.

If at 248 the magnetometer calibration module 26 determines that mobile device's location is not known, the expected values noted above can be determined using one or more other checks at 256 and such expected values compared to the measured (actual) values at 258. For example, expected values can be found in the minimum and maximum expected magnetic field strengths over the entire earth, which are well-known. The measured field strength could thus be compared with this range.

It can be appreciated that for inclination, the value can vary from almost +90 degrees to −90 degrees over the earth, so cannot be reliably predicted. For horizontal field strength, this can typically be determined from the model as well (minimum and maximum values over the earth's surface). Also, if the mobile device 10 has a cellular radio and the cellular radio is turned on, at least the country in which the mobile device 10 is operating should be determinable. In such cases, the limits can be tightened (for example, in Canada the inclination is typically between around −60 and −85 degrees).

Figure 10:
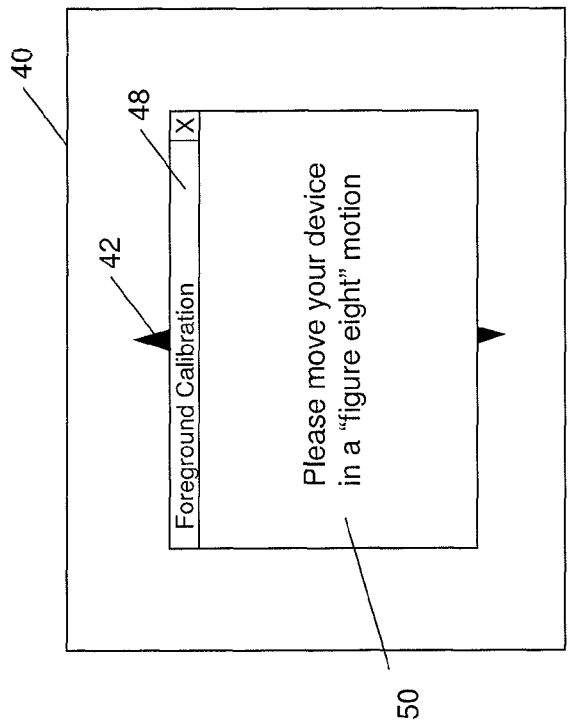
FIG. 10 is a screen shot of an example user interface comprising a prompt for confirming initiation of a magnetometer calibration method.
Figure 9:
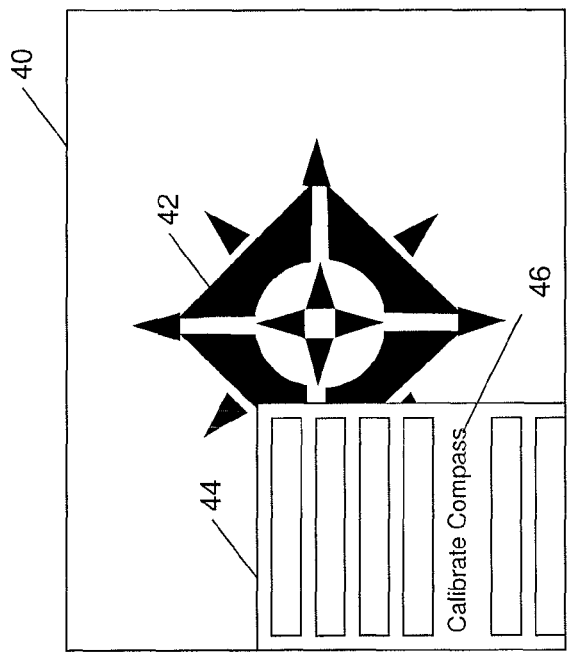
FIG. 9 is a screen shot of an example user interface for an electronic compass application.

As discussed above, calibrations can be triggered by an application 30 or user interaction. FIG. 9 illustrates an example screen shot of a user interface (UI) 40 for a compass application. In this example, a virtual compass 42 is displayed in the UI 40. If the accuracy of the compass 42 is perceived to be inaccurate or of poor quality, the user may initiate a calibration by invoking a menu 44 as shown in FIG. 9 and selecting a calibrate compass option 46. FIG. 10 illustrates a prompt 48 that may be displayed prior to proceeding with a calibration, e.g. upon the application 30 detecting that a calibration is warranted or upon detecting selection of the calibrate compass option 46 in the menu 44. In this example, the prompt 48 corresponds to the initiation of a foreground calibration 218, which typically requires interaction with the user, for example to have the user move the mobile device 10 around in various directions utilizing various movements. In order to have the user assist with this process, the prompt 48 may be displayed to instruct the user as to how to move their mobile device 10 in order to perform the foreground calibration 218, using a notification 50, in this example: "Please move your device in a "figure eight" motion." It can be appreciated that the prompt 48 can be automatically removed from the screen 40 upon the foreground calibration 218 completing.

It has been recognized that different applications 30 which utilize the magnetometer 24 may have different calibration quality/accuracy requirements. For example, a "stud-finder" application may only require low-quality calibrations whereas an augmented reality application may require a relatively higher (or as best as can be achieved) quality calibration. The magnetometer calibration module 26 may therefore be operable to control various portions of the calibration method according to application requirements. In this way, the number of foreground calibrations 218 that are typically required, can be minimized.

As noted above, as the magnetometer 24 is operating, the magnetometer 24 is continually providing sensor readings, calculating quality measurements (e.g. as shown in FIG. 8), and reporting the quality measurements along with the readings. The application 30 using the magnetometer 24 thus receives the quality measures during its operation. It has been found that by storing quality measures on an ongoing basis, an application 30 can use such measures to determine when to request a calibration at any particular time. For example, the application 30 may rely on a number of quality measures, e.g. the last 50 quality measurements, and can use these to average the measures over time. If the application 30 finds that the average quality being reported is not sufficient for its particular needs, the application 30 may then initiate a request to perform a foreground calibration 218.

Figure 11:
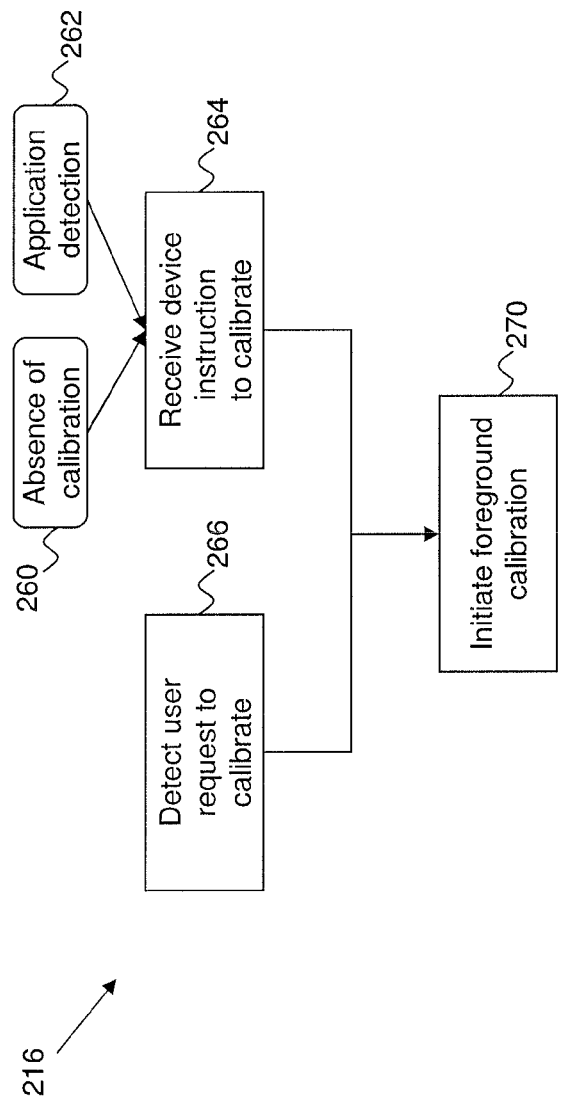
FIG. 11 is a flow chart comprising an example set of computer executable instructions for initiating a calibration method based on a request from an application.

Turning now to FIG. 11, example computer executable instructions, that may be performed by the magnetometer calibration module 26, are shown, which illustrate the handling of a request for calibration from an application 30 or OS 134 at 216 (see FIG. 7). In general therefore, the magnetometer calibration module 26 may receive a device instruction at 264. The device instruction may originate from the application 30 as explained above at 262, or the device instruction may be automatically triggered by, for example, the OS 134. In FIG. 11, an example OS instruction includes detection of the absence of any calibration at 260, which may occur when a mobile device 10 is first used. The magnetometer calibration module 26 may also detect a user request to calibrate the magnetometer 24 at 266. The magnetometer calibration module 26 may therefore determine that a request 216 as shown in FIG. 7 has been made in various ways. Once it is determined that calibration has been requested, the magnetometer calibration module 26 initiates the foreground calibration at 270 (performed at 218 as shown in FIG. 7).

After the foreground calibration is performed at 218 (see also FIG. 7), the application 30 can continue to monitor the quality of the readings, which should improve as the calibration progresses. The foreground calibration 218 may be repeated until the quality is sufficient for the requesting application 30 and its needs. Once the quality is sufficient, the foreground calibration request can be cancelled. Since more than one application 30 may utilize the magnetometer 24 and its readings, the magnetometer calibration module 26 can monitor ongoing application requests and, once there are zero outstanding foreground calibration requests, foreground calibration mode can be terminated. It can be appreciated that by enabling different applications 30 to accept different quality measures, the magnetometer calibration module 26 can optimize processor usage by minimizing the number of foreground calibrations 218 performed. Moreover, since foreground calibrations 218 typically require interaction with the user, such user interactions and the corresponding disruptions can be minimized.

Figure 12:
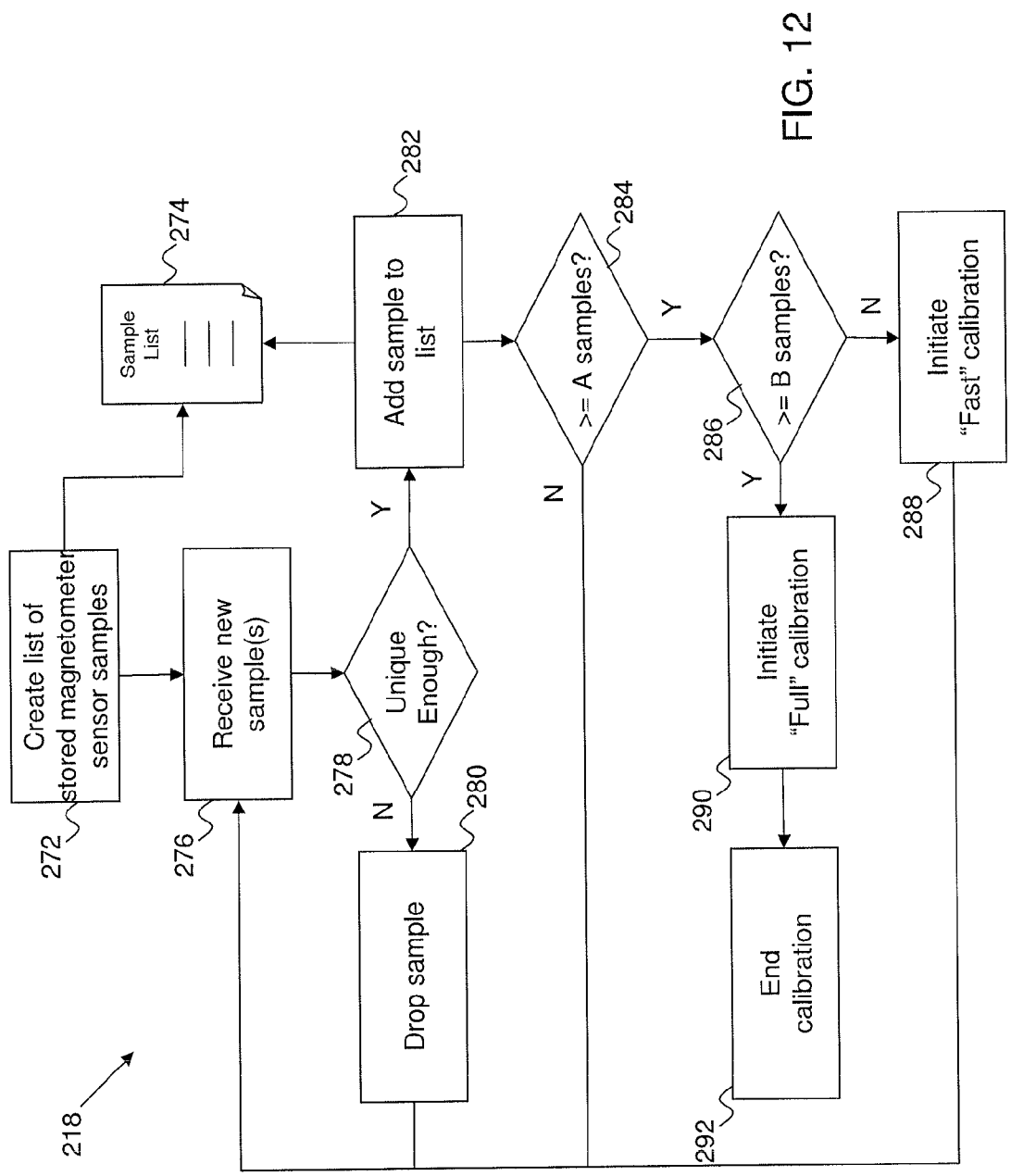
FIG. 12 is a flow chart comprising an example set of computer executable instructions for performing a foreground calibration method.

An example set of computer executable instructions for performing a foreground calibration 218 is shown in FIG. 12. It will be understood to persons skilled in the art that the measurements provided by an erroneous magnetometer moved through all possible orientations creates an ellipsoid when a sphere is desired. The calibration routines described herein are intended to adjust parameters defining the ellipsoid so that a sphere, or a close approximate thereto, is realised. In this example, the foreground calibration 218 has three states, namely: UNCALIBRATED, UNCALIBRATED_DCO, and CALIBRATED. At 272, a list 274 of stored magnetometer sensor samples is created. Initially, the list 274 is empty and the foreground calibration 218 enters the UNCALIBRATED state. The magnetometer calibration module 26 then receives one or more new samples at 276. As these new samples arrive, the samples are compared at 278 with those samples already stored in the list 274 to determine if the new samples are unique enough. Any new sample which is deemed to be too similar to any of the previously stored samples is thus dropped at 280. There are various ways to determine whether or not the received sample is "too close" or "not unique enough". For example, a simple way is to drop samples which are identical to one or more previously stored samples. To provide improved performance, other metrics can be used such as the minimum Euclidean distance between the new sample and every previously-stored sample. If the minimum Euclidean distance is above a threshold, the newly arrived sample may be deemed "sufficiently different or unique" and added to the list 274 at 282.

The magnetometer calibration module 26 then determines at 284 and 286 if enough samples have been accumulated in order to initiate the fast calibration 212 at 288. As will be explained in greater detail below, the fast calibration 212 can be used to correct DC offset only, which is faster than performing a calibration of all three parameters and can be used to assist in increasing the number of samples in the list 274. In FIG. 12, it can be seen that between A and B samples are required to initiate the fast calibration 212 at 288. The number of samples represented by A and B may be chosen according to the techniques used in the fast 212 and full 214 calibrations. For example, as explained below, the fast 212 and full 214 calibrations in the examples provided herein require at least 3 data points to perform a least squares fitting method for DC offset only (i.e. A>=3), and require at least 9 data points to perform a least squares fitting method for all three parameters (i.e. B>=9). A and B can be set as the minimum requirements or can be higher if desired. However, as will be shown, by requiring 4 values, the first, second and third values can be used to compute a DC offset for the first, second and third axes and the fourth value can be used to determine the radius of a sphere.

In the present example, once the number of readings in the list 274 is greater than or equal to 4, but not yet greater than or equal to 9, the fast calibration 212 is initiated at 288. The fast calibration 212 may be repeated in order to more quickly increase the number of readings in the list 274 in order to get to the full calibration 290. Once the fast calibration is successful, the foreground calibration 218 enters the UNCALIBRATED_DCO state. If the foreground calibration 218 is in the UNCALIBRATED or UNCALIBRATED_DCO states, once 9 or more readings are in the list 274, the full calibration 214 is initiated at 290 in order to correct all three calibration parameters. When the full calibration succeeds, the foreground calibration 218 enters the CALIBRATED state and the calibration ends at 292.

It may be noted that in this example, if the foreground calibration 218 is in the UNCALIBRATED_DCO or CALIBRATED states, the calibration corrections may be applied to the raw input sensor data in order to obtain the calibrated output data. With the foreground calibration 218 complete, as was discussed above, the ongoing calibration 204 takes over, e.g. to perform background calibration 210 when appropriate.

It can be appreciated that separating the foreground calibration 218 into two stages, one comprising a fast calibration 212 and the other comprising a full calibration 214, several desirable advantages are realized. The fast calibration 212 initially provides coarse heading information with very little device movement required. As the user continues to move the mobile device 10, the fast calibration 212 is able continually refine the calibration. Once the user has moved the mobile device 10 through more movements, a full and accurate calibration is performed to compensate for all three parameters. In other words, as the user begins moving the mobile device 10, the magnetometer calibration module 26 can quickly begin calibrating the magnetometer 24, even if the user has not made significant movements yet.

The background calibration 210 may be performed on an ongoing basis when the magnetometer calibration module 26 detects that the quality of the magnetometer readings are not of sufficient quality (e.g. above a particular threshold as shown in FIG. 7). The background calibration 210 is thus used to continually improve the accuracy of the calibration, without requiring user intervention or special gestures or movements. This differs from the foreground calibration 218 discussed above, which is invoked when calibration is requested by an application 30, OS 134, user, etc. However, as will be seen below, the background calibration 210 utilizes many of the same techniques used in the foreground calibration 218, namely operations 272 through 292 in FIG. 12.

Figure 13:
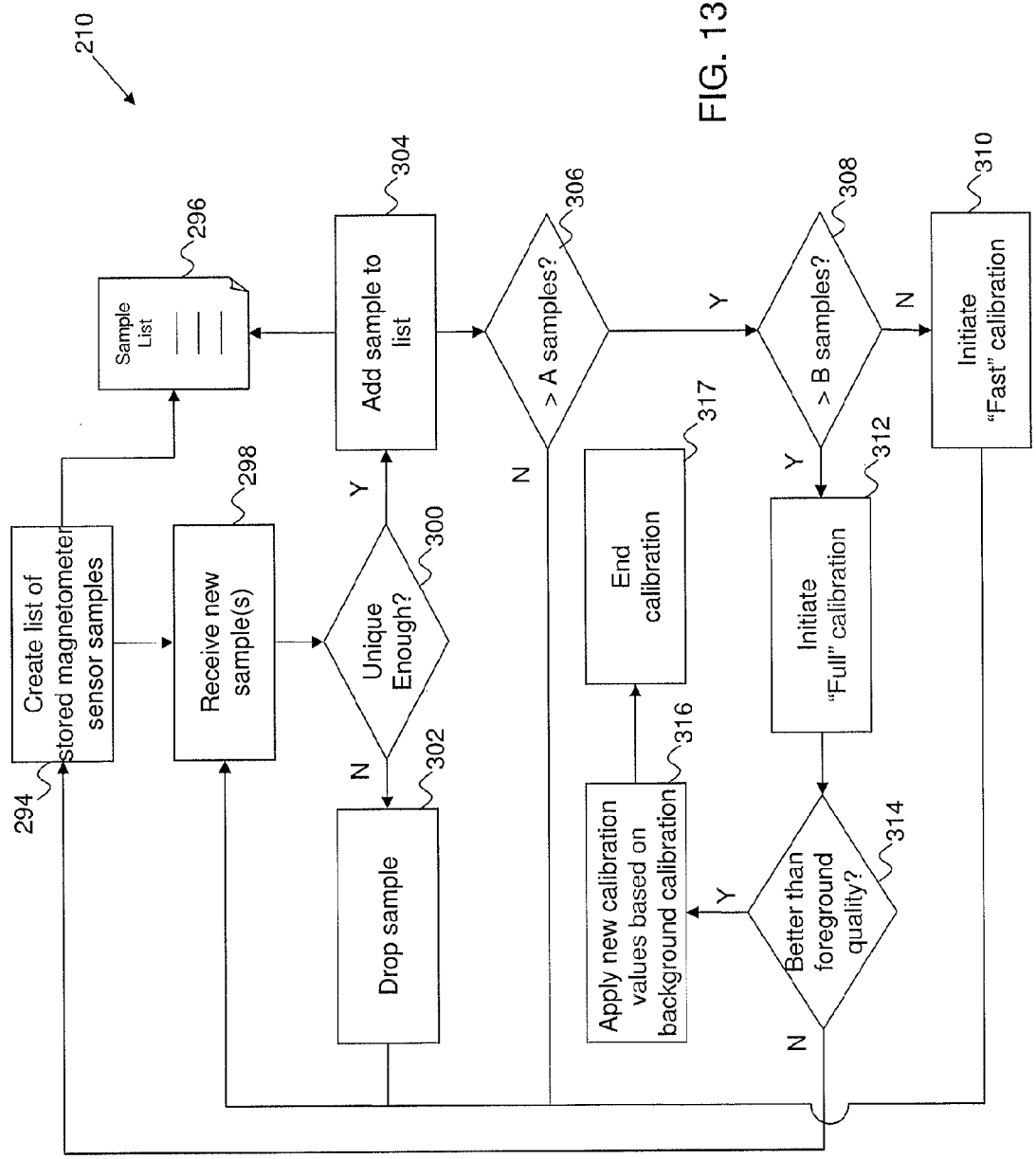
FIG. 13 is a flow chart comprising an example set of computer executable instructions for performing a background calibration method.

Turning now to FIG. 13, an example set of computer executable instructions for enabling the magnetometer calibration module 26 to perform a background calibration 210 is shown. In this example, the background calibration 210 has four states, namely: CALIBRATED, CALIBRATED_SEARCHING, CALIBRATED_SEARCHING_DCO, and CALIBRATED_TESTING. Since the background calibration 210 is ongoing, the background calibration 210 is normally in the CALIBRATED state. As noted above, in this state, the calibration quality is continually being checked (at 206—see FIG. 7). The magnetometer calibration module 26 (or a module dedicated to the background calibration 210) may keep an average of, e.g. 100 quality estimates. If the average quality over that period drops below a predefined threshold, the magnetometer calibration module 26 determines that background calibration 210 is required and enters the CALIBRATED_SEARCHING state and the method in FIG. 13 begins.

When in the UNCALIBRATED state, at 294, a list 296 of stored magnetometer sensor samples is created. Initially, the list 296 is empty. The magnetometer calibration module 26 then receives one or more new samples at 298. As these new samples arrive, the samples are compared at 300 with those samples already stored in the list 296 to determine if the new samples are unique enough. Any new sample which is deemed to be too similar to any of the previously stored samples is thus dropped at 302. There are various ways to determine whether or not the received sample is "too close" or "not unique enough". For example, a simple way is to drop samples which are identical to one or more previously stored samples. To provide improved performance, other metrics can be used such as the minimum Euclidean distance between the new sample and every previously-stored sample. If the minimum Euclidean distance is above a threshold, the newly arrived sample may be deemed "sufficiently different or unique" and added to the list 296 at 304.

The magnetometer calibration module 26 then determines at 306 and 308 if enough samples have been accumulated in order to initiate the fast calibration 212 at 310. As will be explained in greater detail below, the fast calibration 212 can be used to correct DC offset only, which is faster than performing a calibration of all three parameters and can be used to assist in increasing the number of samples in the list 296. In FIG. 13, it can be seen that between A and B samples are required to initiate the fast calibration 212 at 310. The number of samples represented by A and B may be chosen according to the techniques used in the fast 212 and full 214 calibrations. For example, as explained below, the fast 212 and full 214 calibrations in the examples provided herein require at least 3 data points to perform a least squares fitting method for DC offset only (i.e. A>=3)—but may use a fourth data point to determine the radius of the sphere, and require at least 9 data points to perform a least squares fitting method for all three parameters (i.e. B>=9). A and B can be set as the minimum requirements or can be higher if desired.

In the present example, once the number of readings in the list 296 is greater than or equal to 4, but not yet greater than or equal to 9, the fast calibration 212 is initiated at 310 and the background calibration 210 enters the CALIBRATED_SEARCHING_DCO state. The fast calibration 212 may be repeated in order to more quickly increase the number of readings in the list 296 in order to improve the fast calibration 212. If the background calibration 210 is in the CALIBRATED_SEARCHING or CALIBRATED_SEARCHING_DCO states, once 9 or more readings are in the list 296, the full calibration 214 is initiated at 312 in order to correct all three calibration parameters. Once the full calibration succeeds, the background calibration 210 enters the CALIBRATED_TESTING state.

It may be noted that in all states, stored correction values from previous foreground calibrations 218 may be applied to the raw sensor data. The thus calibration data (based on foreground calibration parameters) is then checked for quality and the result stored (not shown). The foreground qualities may then be averaged over, e.g. 100 samples. If the average foreground quality exceeds a predefined threshold, then the background calibration 210 is determined to no longer be needed. In this case, the background calibration 210 returns to the CALIBRATED state without completing. It can be appreciated that since foreground calibrations 218 may be performed separately from the background calibrations 210 if the magnetometer calibration module 26 was already able to achieve sufficient calibration, the magnetometer calibration module 26 can minimize processor load by prematurely ending the background calibration.

It may also be noted that in this example, if the background calibration 210 is in the CALIBRATED_SEARCHING_DCO or CALIBRATED_TESTING states, the background calibration corrections may be applied to the raw input sensor data in order to obtain the calibrated output data. The calibrated measurements may then be checked for quality and the results stored. An average of background qualities may then be obtained, e.g. over 100 measurements. The magnetometer calibration module 26 may then determine at 314 if the background qualities are better than the stored foreground qualities. If not, the background calibration 210 has failed and the background calibration 210 returns to the CALIBRATED_SEARCHING state by returning to 294. If however, the background qualities are better, the background calibration 210 has succeeded and the new calibration parameters are applied based on the background calibration 210 at 316 and the old foreground values are deleted. The background calibration 218 then returns to the CALIBRATED state and calibration ends at 317.

As discussed above, both the foreground calibration 218 and background calibration 210 may utilize a fast calibration 212 to estimate and remove DC offset/bias from a set of readings, in this example of a three-axis magnetometer 24. Removing such an offset is considered important as the offset is a main contributor to the overall magnetometer inaccuracy.

Figures 14, 15:
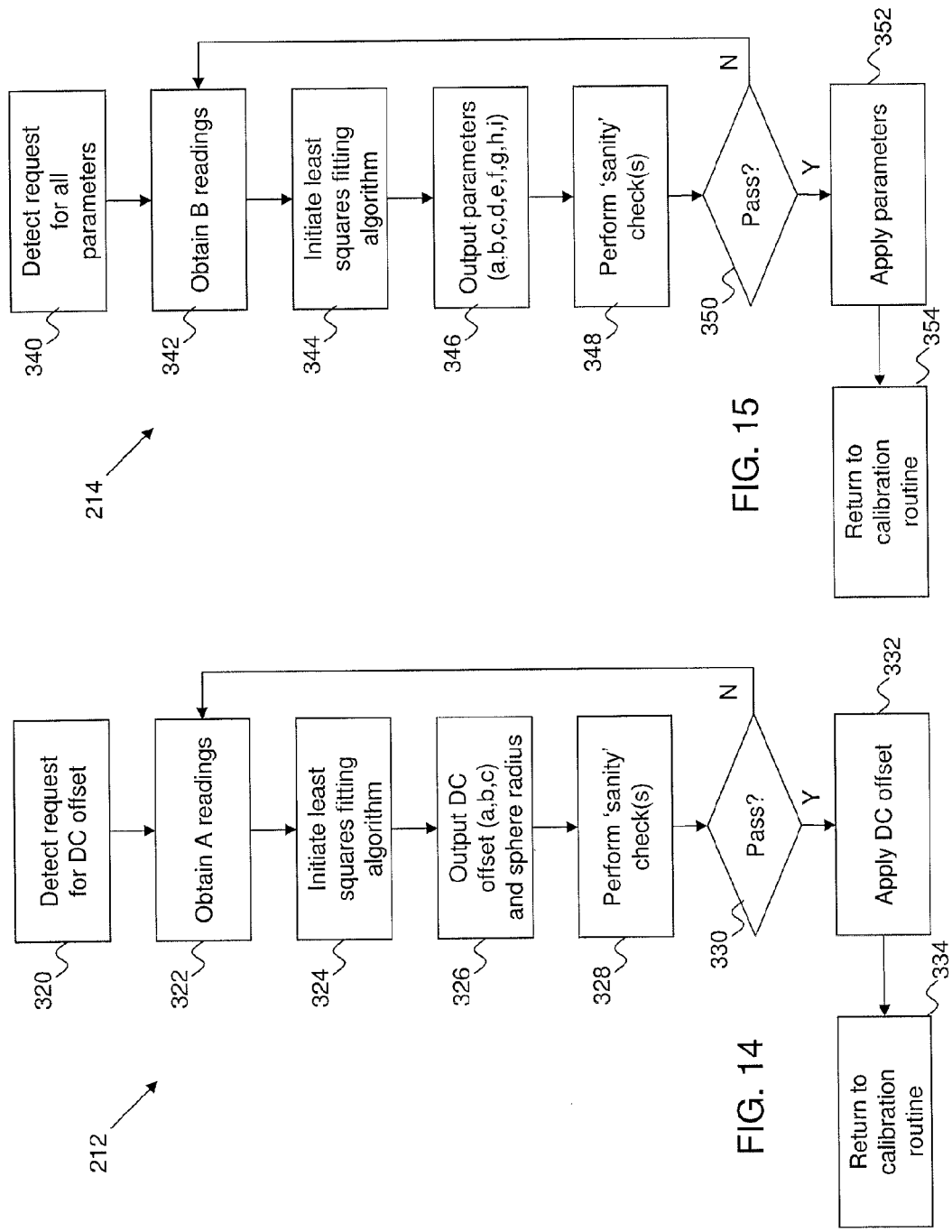
FIG. 14 is a flow chart comprising an example set of computer executable instructions for performing a fast calibration.
FIG. 15 is a flow chart comprising an example set of computer executable instructions for performing a full calibration.

The fast calibration 212 is initiated when 3 or more sufficiently different or unique readings have been obtained. FIG. 14 illustrates an example set of computer executable instructions for performing the fast calibration 212. At 320, the magnetometer calibration module 26 detects a request for a DC offset (i.e. the "fast" calibration). The A readings (e.g. 3 or more—in this example 4 to determine radius of sphere) are obtained at 322, and a least squares fitting algorithm is initiated at 324. The least squares fitting algorithm is used to find the best fit of the raw data to the model being used. It has been found that a suitable model assumes that the magnetic field is spherical with radius R and center at (t, u, v), namely: $(X-t)^2+(Y-u)^2+(Z-v)^2=R^2$. The output of the least squares fitting algorithm is then obtained at 326 and includes the values (t, u, v), and the radius R. The outputs may then be "sanity" checked at 328 to discard obviously erroneous results. For example, the minimum and maximum total magnetic strength over the entire earth are known and thus results that have an R value outside of this range can be deleted. Also, based on, for example, the mobile device's ADC (analog-to-digital conversion) range, upper and lower bounds of possible ranges of DC offsets can be performed to also eliminate likely erroneous results. Once a DC offset is found to pass the sanity checks at 330, the DC offset can be applied at 332 to correct the raw sensor readings, by subtracting the estimated DC offset for each axis. The magnetometer calibration module 26 may then return to the calibration routine which requested the fast calibration at 334 (i.e. the foreground calibration 218 or background calibration 210).

The full calibration 214 is used to estimate and remove the effects of not only DC offset/bias, but also gain and inter-axis misalignment errors from a set of readings of a three-axis magnetometer 24. Removing such effects is important in order to maximize the overall accuracy of the magnetometer 24 and the applications 30 utilizing same.

The full calibration 214 is initiated when 9 or more sufficiently different or unique readings have been obtained. FIG. 15 illustrates an example set of computer executable instructions for performing the full calibration 214. At 340, the magnetometer calibration module 26 detects a request for all three parameters to be corrected (i.e. the "full" calibration). The B readings (e.g. 9 or more) are obtained at 342, and a least squares fitting algorithm is initiated at 344. The least squares fitting algorithm is used to find the best fit of the raw data to the model being used. It has been found that a suitable model assumes that the magnetic field has a center at (a, b, c) namely: $aX^2+bY^2+cZ^2+dXY+eXZ+fYZ+gX+hY+iZ=1$. The output of the least squares fitting algorithm is then obtained at 346 and includes the values (a, b, c, d, e, f, g, h, i), which are converted into gains, offsets and angles through a transformation as will be explained in greater detail below. The outputs may then be "sanity" checked at 348 to discard obviously erroneous results. For example, the quadratic equation above can represent many geometric shapes such as hyperboloids, cones, etc. However, it is understood from the physics of the magnetometer 24 that the correct solution to the model should be an ellipsoid. Thus, any non-ellipsoid solutions can be discarded. Additionally, other sanity checks such as knowledge of the minimum and maximum possible DC offsets, allowable range of gains, etc. can be used to discard other erroneous values. Once a DC offset is found to pass the sanity checks at 350, the DC offset can be applied at 352 to correct the raw sensor readings, by applying the calibration parameters to the incoming raw sensor samples in order to compensate for the biases, gains, and misalignment errors. The magnetometer calibration module 26 may then return to the calibration routine which requested the fast calibration at 354 (i.e. the foreground calibration 218 or background calibration 210).

An example 9-point full calibration and an example 4-point fast calibration using a least square algorithm will now be provided.

For a 9-point "full" calibration, using least-squares, the following equation is solved:

$$aX^2+bY^2+cZ^2+dXY+eXY+fYZ+gX+hY+iZ=1$$

Solving this equation results in the values for a, b, c, d, e, f, g, h, and i. These values are then converted as follows:

$$q1=\text{sqrt}(a);$$

$$q2=d/(2*q1);$$

$$q3=e/(2*q1);$$

$$q4=g/(2*q1);$$

$$q5=\text{sqrt}(b-q2^2);$$

$$q6=(f/2-q2*q3)/q5;$$

$$q7=(h/2-q2*q4)/q5;$$

$$q8=\text{sqrt}(c-q3^2-q6^2);$$

$$q9=(i/2-q3*q4-q6*q7)/q8;$$

The different q values then form the following matrix:

$$\text{Transform} = \begin{bmatrix} q1 & q2 & q3 & q4 \\ 0 & q5 & q6 & q7 \\ 0 & 0 & q8 & q9 \\ 0 & 0 & 0 & 1 \end{bmatrix}$$

The T matrix above is then scaled so that the T matrix has the appropriate magnitude. Calibration parameters can be used to correct a raw sample point (x,y,z) by performing the following actions:

1) Create the column vector: Input=[x y z 1]T
2) Calculate the Matrix-vector product: Output=Transform*Input
3) Then the Output vector has the corrected x, y and z in entries 1, 2, and 3.

It may be noted that the centers, gains and angles may not need to be calculated in order to apply the compensation method. Instead, only the Transform matrix as described above may be required.

For the 4-point "fast" calibration, using least-squares, the following equation is solved:

$$tX+uY+vZ+w=(-X^2+Y^2+Z^2)$$

From this equation, solutions for parameters t, u, v, and w are obtained. The following transformation matrix Transform can be obtained:

$$\text{Transform} = \begin{bmatrix} 1 & 0 & 0 & (t/2) \\ 0 & 1 & 0 & (u/2) \\ 0 & 0 & 1 & (v/2) \\ 0 & 0 & 0 & 1 \end{bmatrix}$$

The estimated radius is given by:
Radius=Sqrt((-t/2)^2+(-u/2)^2+(-v/2)^2-w), and the estimated DC offset can be obtained by feeding the Transform matrix into the routine below.

To determine the estimated center, gains and angles from the T matrix, the following function may be used:

function [center gains angles]=calcTransformParams (T)

Figure 16:
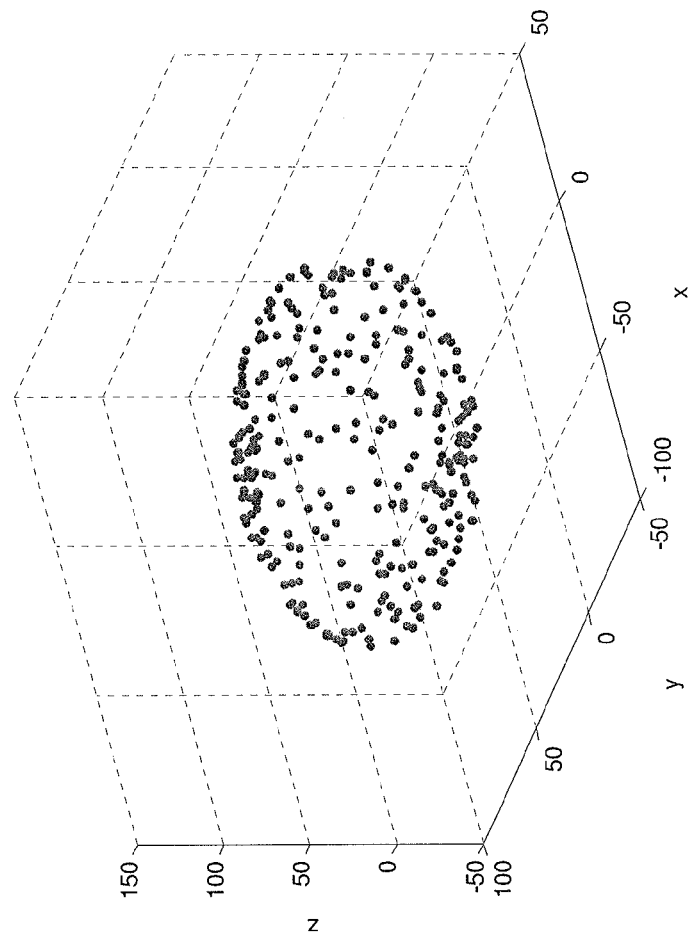
FIGS. 16 to 18 are data point graphs for illustrating effects of applying a least squares fitting algorithm.

$iT=\text{inv}(T);$ $gz=iT(3,3);$ $gy=\text{sqrt}(iT(2,2)^2+iT(2,3)^2);$ $s\text{phi}=-iT(2,3)/gy;$ $\text{phi}=a\sin d(s\text{phi});$ $gx=\text{sqrt}(\text{sum}(iT(1,1:3)^2));$ $s\text{lambda}=-iT(1,3)/gx;$ $\text{lambda}=a\sin d(s\text{lambda});$ $s\text{rho}=-iT(1,2)/gx/\cos d(\text{lambda});$ $\text{rho}=a\sin d(s\text{rho});$ $\text{center}=iT(1:3,4)';$ $\text{gains}=[gx\ gy\ gz];$ $\text{angles}=[\text{rho phi lambda}];$ end An example of 4-point and 9-point calibration is shown in FIG. 16. The points shown have an actual DC offset of (−30, 20, 40), gains of (1, 0.9, 1.1), misalignment angles of (2, −3, 0) degrees and a radius of 55.

Using the 4-point "fast" calibration, the following values can be estimated:

Estimated DC offset=(−29.8115, 19.9337, 38.8898)

Estimated radius=55.5717

And the transform matrix:

| 1.0000 | 0 | 0 | 29.8115 |
|---|---|---|---|
| 0 | 1.0000 | 0 | −19.9337 |
| 0 | 0 | 1.0000 | −38.8898 |
| 0 | 0 | 0 | 1.0000 |

Figure 17:
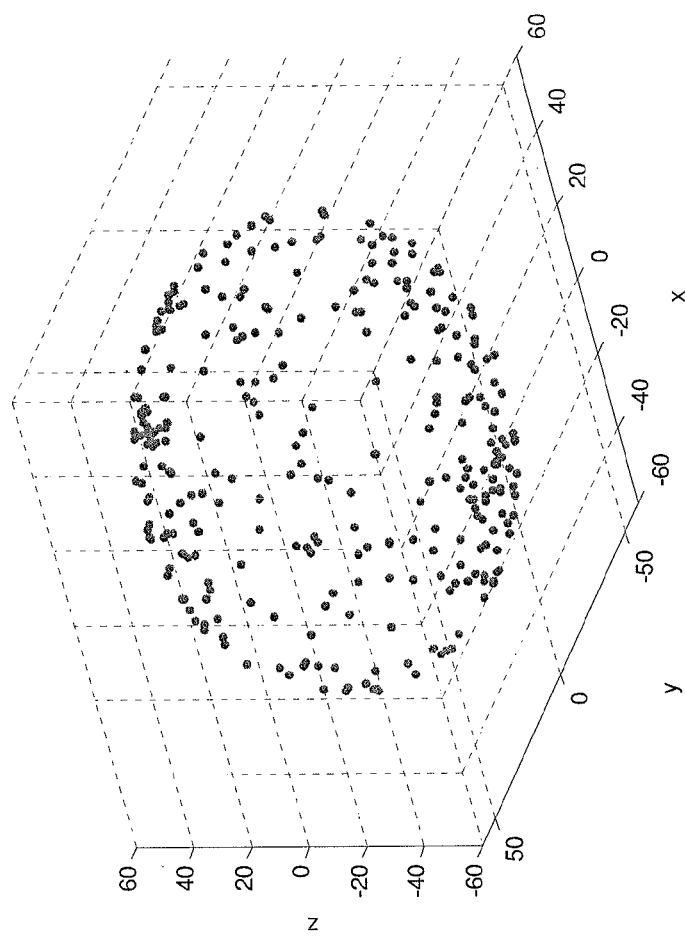

These parameters may then be used to correct the points resulting in the example shown in FIG. 17.

Using the 9-point "full" calibration, the following values may be estimated:

Estimated DC offset=(−29.8796, 20.0476, 39.9490)

Estimated gains=(1.0074, 0.8972, 1.0963)

Estimated angles=(−2.1244, 2.6167, 0.0184)

And the transform matrix:

$$\begin{matrix} 0.9933 & -0.0414 & -0.0013 & 30.5589 \\ 0 & 1.1157 & 0.0417 & -24.0332 \\ 0 & 0 & 0.9122 & -36.4408 \\ 0 & 0 & 0 & 1.0000 \end{matrix}$$

Figure 18:
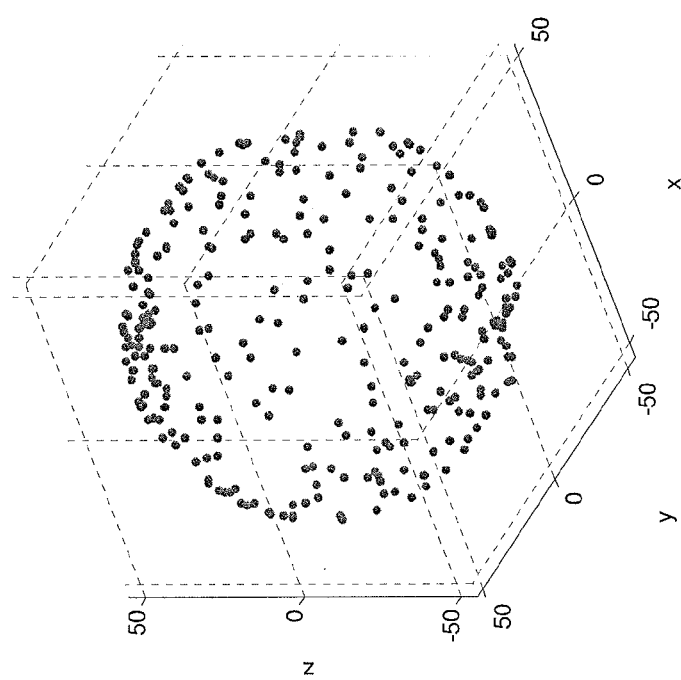

When these parameters are used to correct the points of the above figure, the corrected data shown in FIG. 18 is obtained.

Figure 19:
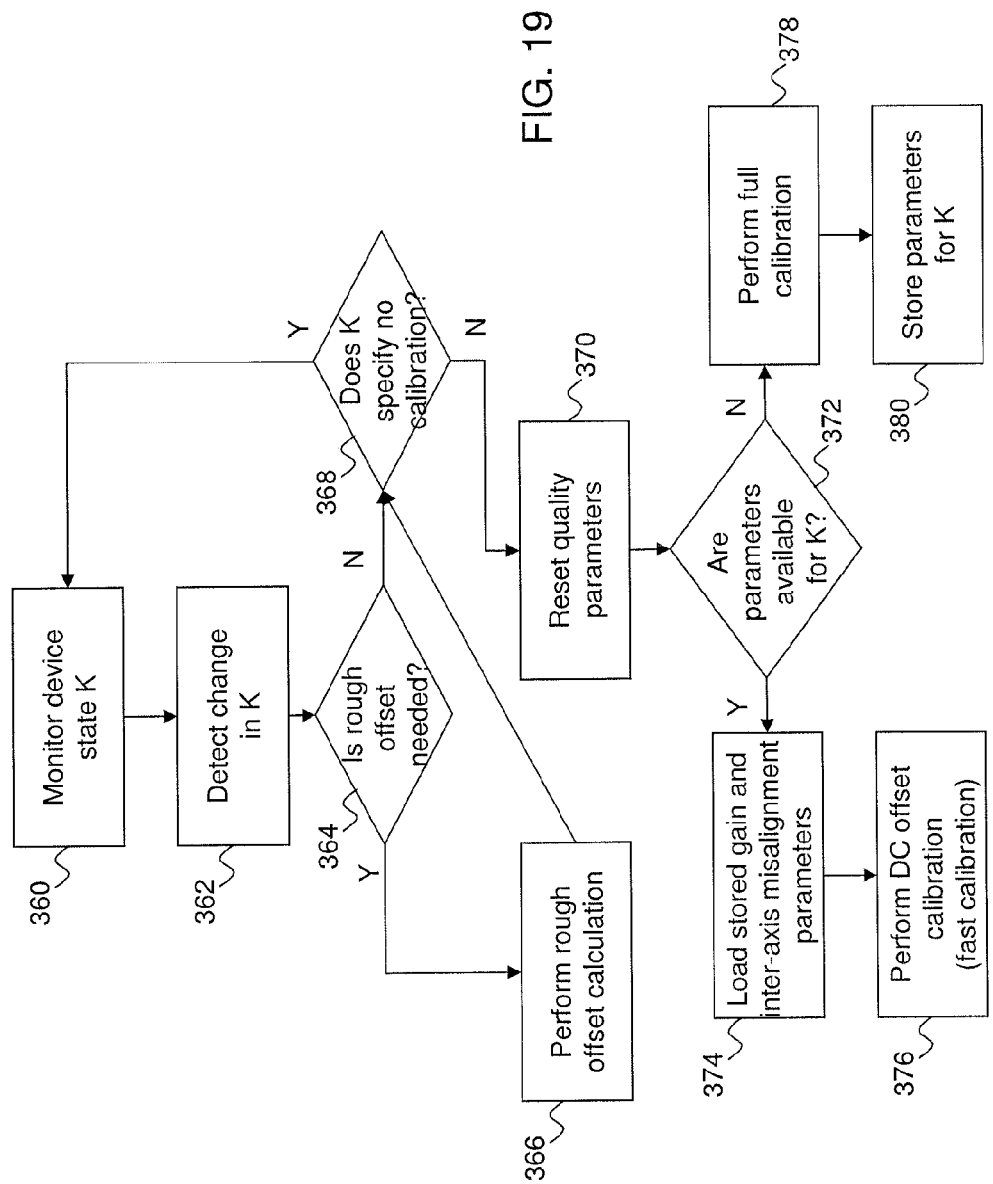
FIG. 19 is a flow chart comprising an example set of computer executable instructions for initiating a calibration method based on a detected change in device state.

Returning to FIG. 7, as discussed above, changes in device state detected at 226 can be used to initiate a branch of the ongoing calibration 204 in order to compensate or account for changing environments or effects from moving between different states. For example, the holster, slider and flip states shown in FIGS. 2 to 4 (i.e. holstered/unholstered, and opened/closed states as determined by device sensors) can be used to determine when to re-calibrate the magnetometer 24. It has been recognized that changes in these states can have a direct impact on the magnetometer's performance. For example, a slider mechanism for sliding the keyboard 12 out from behind a touch screen display 13 may include various metal parts as well as several magnets. It has been found that the performance of the magnetometer 24 and the resultant calibration parameters that would be calculated can be very different depending on when the slider is opened versus closed. As such, the holster, slider, and flip states may therefore be monitored at 360 to detect a change in state at 362 as shown in FIG. 19.

The magnetometer calibration module 26 in this example may be programmed to continually track or otherwise become aware of the current state of the mobile device 10. The current state in this example may be denoted K, and any N number of states may be tracked. For example, a slider-equipped device such as that shown in FIG. 3 may have N=3 states, namely K=0 when out of holster and slider closed, K=1 when out of holster and slider opened, and K=2 when in holster (assuming the slider cannot be opened when the mobile device 10 is holstered). It can be appreciated that different device types may have different numbers of states and thus different allowable ranges for K.

The magnetometer calibration module 26 upon detecting a change in K at 362 then determines if a rough offset calculation is needed at 364. The rough offset calculation is a hardware offset that can be applied by the magnetometer 24 to bring the magnetometer 24 back into a useable range. It has been found that some magnetometers 24 (e.g. Aichi Steel AMI306) contain a measurement range of +/−12 Gauss, with a moving range of +/−3 Gauss. This means that the magnetometer 24 is capable of measuring from −12 to 12 Gauss, but only with a window of 6 Gauss. When the physical environment that the magnetometer 24 experiences changes, the magnetic field that is present might fall outside of the 6 Gauss window. The magnetometer's sensor could then be saturated at either extreme, rendering the magnetometer's sensor ineffective. It can be appreciated that saturated can mean that, even though the actual magnetic field values are changing, the device cannot detect/report the changing magnetic field values since the magnetic field values are outside the range of the window. As such, the user may see that the reading doesn't change at all as the mobile device 10 is moved around.

It has therefore been recognized that changes in device states can be used to trigger the magnetometer 24 to perform a hardware offset calculation to bring the magnetometer 24 back into a useable range. Flipping or sliding a mobile device 10 typically changes the physical environment and may alter the magnetic field present. When a device sensor (e.g. one that can detect a flip, slide, holstering, etc.) detects this change, a magnetometer hardware offset calibration is performed at 366. This will allow the sensor to continue to observe the magnetic field, thus allowing the magnetometer calibration module 26 to recalibrate to the current magnetic field.

Whether or not the rough offset is needed and applied, the magnetometer calibration module 26 may then determine if the current state K specifies that no calibration is needed at 368. In the case of certain physical device configurations, it has been found that the magnetometer 24 does not perform well, or possibly even work at all. For example, the device holster 20 may contain large magnets (both to activate the holster sensor as well as to keep the holster flap closed). When the mobile device 10 is inside the holster, the magnetometer 24 and applications 30 using the magnetometer 24 likely will not work. For such device configurations, the magnetometer calibration module 26 can use the indication of K to avoid attempting to re-calibrate the magnetometer 24 in an environment in which the magnetometer 24 likely cannot be calibrated. Moreover, in states such as a holstered state, it may be more likely that the applications 30 using the magnetometer 24 are not being used since the holster 20 effectively stows the mobile device 10 providing further incentive to avoid unnecessary calibrations.

If calibration is to be performed, the magnetometer calibration module 26 can reset its quality parameters at 370, i.e. the magnetometer calibration module 26 can discard the stored quality history from the previous state. This can be important because the quality check 206 relies on having stored quality information over a number of successive readings and, if the physical environment in which those samples were taken has changed, the samples should be discarded to avoid reporting incorrect quality values.

The magnetometer calibration module 26 can store or otherwise determine a different set of calibration parameters for each value of K. The magnetometer calibration module 26 can then determine at 372 if parameters are available for K such that the magnetometer calibration module 26 can load the appropriate parameters for the new K value whenever K changes. If there are stored parameters, the stored gain and inter-axis misalignment parameters in this example are loaded at 374 and the DC offset calibration (fast calibration 212) is performed at 376 to get fresh DC offset parameters. It can also be appreciated that all three parameters may be loaded if the parameters are available.

If no stored calibration parameters exist yet for K (e.g. if it is the first time that the user has used the mobile device 10 in that state), the magnetometer calibration module 26 can calibrate the magnetometer 24 using a full calibration 214 at 378 and store the parameters for K, e.g. in non-volatile memory, so that the parameters for K can be used again whenever the mobile device 10 is used in that state.

Figure 20:
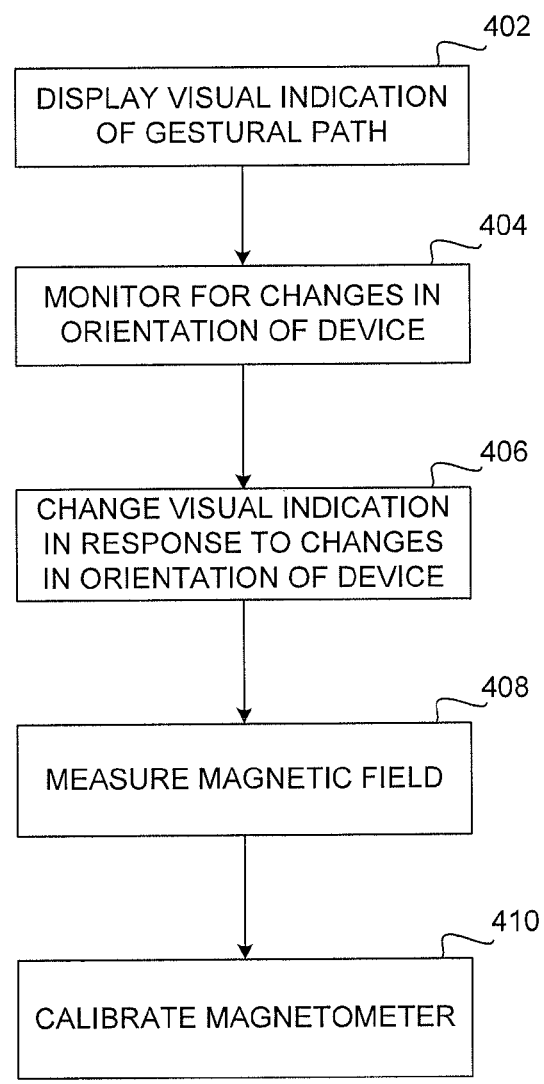
FIG. 20 is a flow chart of a method for calibrating a magnetometer with visual affordance in accordance with one embodiment of the present disclosure.

FIG. 20 illustrates an example set of computer executable instructions that may be executed by the magnetometer calibration module 26 to perform foreground calibrations of the magnetometer 24 and to compensate for changing environments or conditions. At 402, a user interface screen of a calibration application is displayed on a display 34 of the mobile device 10. The user interface screen includes a visual indication of a gestural path. The gestural path represents a plurality of orientations of the mobile device 10 and defines a calibration gesture to be performed by a user. The plurality of orientations of the gestural path corresponds to a series of gestures or changes in the orientation of the mobile device 10. In the described examples, the series of gestures includes a tilt left, tilt up, tilt down and tilt right. A tilt up is caused when the top 122 of the mobile device 10 is tilted upwards towards the user and the bottom 124 of the mobile device 10 is tilted downwards. A tilt down is caused when the top 122 of the mobile device 10 is tilted downwards away from the user and the bottom 124 of the mobile device 10 is tilted upwards. Depending on the particular visual indication which is provided, the series of gestures may be performed in any order or must be performed in a particular order. For calibration purposes, the order of the gestures does not matter. The performance of the series of gestures in a particular order may facilitate learning of the calibration gestures, particularly when the series of gestures is selected to reproduce a known and/or natural flowing motion. Learning of the calibration gestures allows future calibrations to be performed more quickly and may obviate the need for the calibration GUI in the future.

The foreground calibration can be triggered upon detecting a request for calibration from an application 30 or the OS 134. It can be appreciated that the request can be initiated by the application itself or via a user input (e.g. using a menu as discussed below). The foreground calibration may utilize the fast 212 and full 214 calibrations. As noted above, foreground calibration differs from the background calibration in that the foreground calibration relies on active user engagement in order to move the mobile device 10 in various directions in order to obtain different readings.

Figure 21C:
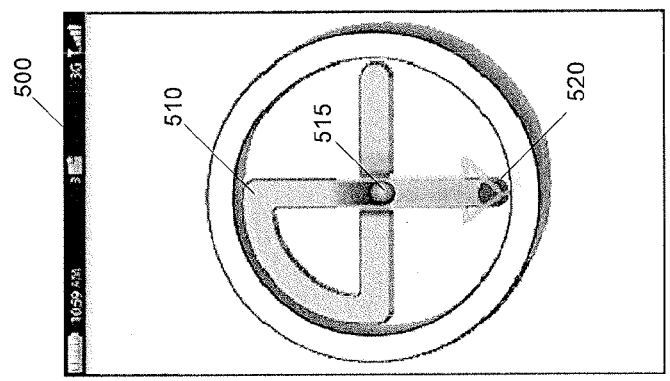
FIGS. 21A-21C are screen shots of example user interfaces comprising a visual indication of a gestural path for a magnetometer calibration method in accordance with one embodiment of the present disclosure.
Figure 21B:
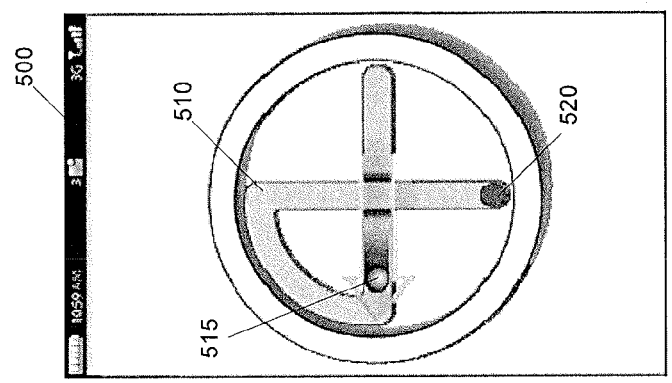
Figure 21A:
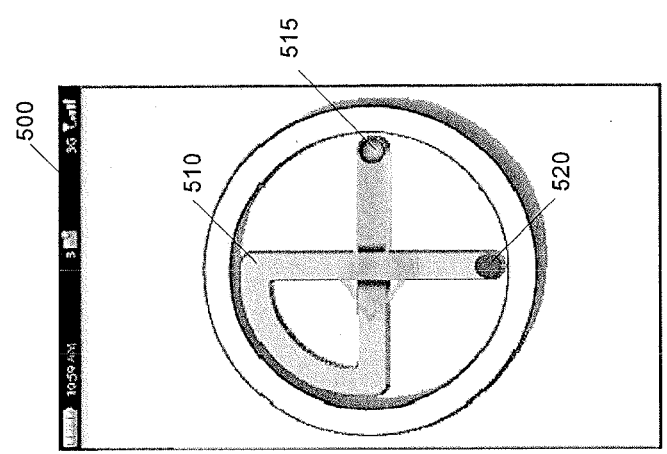

The visual indication of the gestural path provided by the user interface screen may take one of several forms. FIGS. 21A-21C illustrate one example of a user interface screen 500 of the calibration application. The visual indication comprises a track 510 and an object 515 moveable within the track 510 in response to the monitored changes in the orientation of the mobile device 10. In the shown example, the object 515 is a ball. In other examples, the object 515 may be a flowing liquid. An arrow is used in FIGS. 21A-21C to show the direction of movement of the ball for purposes of illustration. The arrow typically does not form part of the user interface screen 500, but could be provided in the user interface screen 500 if desired.

Changes in the orientation of the mobile device 10 cause a position of the object 515 to move within the track 510. In FIG. 21A, the ball is located at an initial position. The mobile device 10 is in a reference position in FIG. 21A, such as a substantially horizontal position (or orientation). Tilting the mobile device 10 in a particular direction causes corresponding movement of the object 515 (e.g., ball) within the track 510 in the particular direction of the tilting. In other examples, the directionality may be reversed so that tilting the mobile device 10 in a particular direction causes corresponding movement of the object 515 within the track 510 in a direction opposite to the particular direction of the tilting. Tilting the mobile device 10 left causes the ball to move leftwards along the track 510. When the ball reaches the leftward end of the track 510, tilting the mobile device 10 downwards causes the ball to move towards the top of the track 510. When the ball reaches the top of the track 510, tilting the mobile device 10 upwards causes the ball to move towards the bottom of the track 510. The end of the track 510 is indicated by the reference 520. When the ball reaches the end 520, the ball may drop through a hole to indicate that the gestural path has been completed. Alternatively, the ball and/or possibly the user interface screen 500 may disappear to indicate completion of the gestural path. It will be appreciated that the gestural path provided by the user interface screen 500 is performed in a particular order to move the object through the track 510.

FIGS. 22A-22D illustrate another example of a user interface screen 530 of the calibration application. The visual indication comprises a series of four tracks 540 and an object 545 moveable within each track 540 in response to changes in the orientation of the mobile device 10. Tracks are located at the top, bottom, left and right of the user interface screen 530. Each track is used to provide a visual indication of changes in orientation along a respective direction (e.g., left, right, up, down). For ease of illustration, the track and object are only labelled for one track-object pair. In the shown example, the object 545 is a ball. In other examples, the object 545 may be a flowing liquid. The end of each track 540 is indicated by the reference 550. An arrow is used in some of FIGS. 22A-22C to show the direction of movement of the ball for purposes of illustration. The arrow typically does not form part of the user interface screen 530, but could be provided in the user interface screen 530 if desired.

Figure 22D:
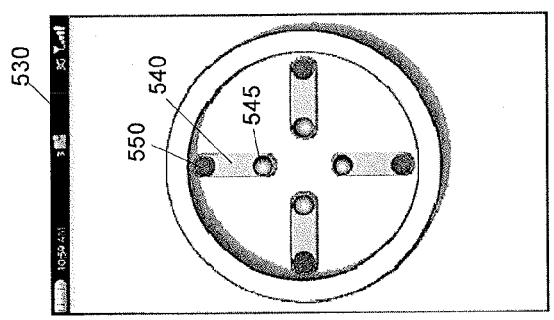
FIGS. 22A-22D are screen shots of example user interfaces comprising a visual indication of a gestural path for a magnetometer calibration method in accordance with another embodiment of the present disclosure.
Figure 22C:
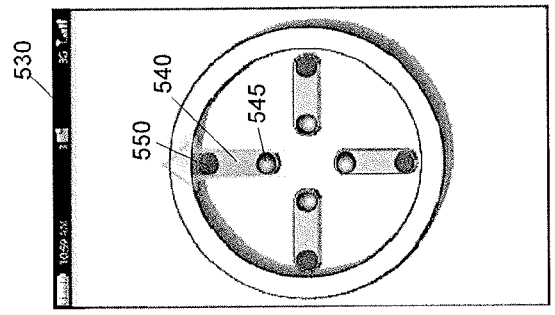
Figure 22B:
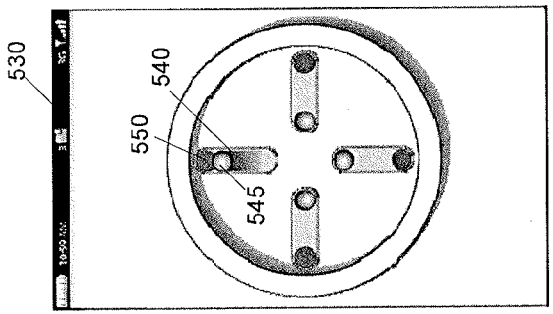
Figure 22A:
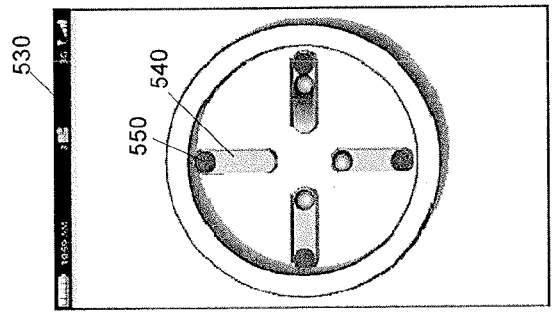

Changes in the orientation of the mobile device 10 cause a position of the object 545 to move within the track 540. In FIG. 22A, each ball is located at an initial position in the respective track 540. The mobile device 10 is in the reference position in FIG. 22A such as a substantially horizontal position. Tilting the mobile device 10 in a particular direction causes corresponding movement of the objects 545 (e.g., balls) within the respective tracks 540 in the particular direction of the tilting. For example, tilting the mobile device 10 left from the reference position causes the ball in the left track to move left towards its end 550, tilting the mobile device 10 up from the reference position causes the ball in the bottom track to move down towards its end 550, tilting the mobile device 10 right from the reference position causes the ball in the right track to move right towards its end 550, and tilting the mobile device 10 down from the reference position causes the ball in the top track to move up towards its end 550. When each ball reaches the end 550 of its respective track 540, the ball drops through a hole to indicate that that part of the gestural path has been completed.

In other examples, the directionality may be reversed so that tilting the mobile device 10 in a particular direction causes corresponding movement of the objects 545 within the respective tracks 540 in a direction opposite to the particular direction of the tilting. It will be appreciated that the gestural path provided by the user interface screen 530 may be performed in any order to move the object through the tracks 540. Alternatively, the arrow shown in the figure can be shown on the UI to indicate the order in which the gestures are to be done.

Figure 23:
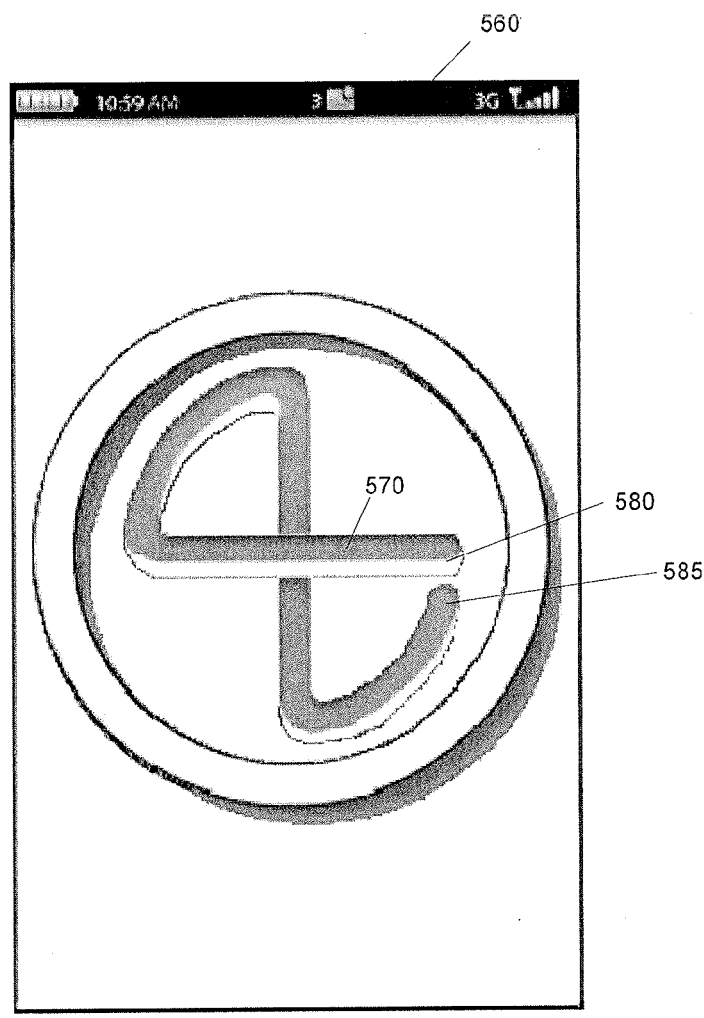
FIG. 23 is a screen shot of an example user interface comprising a visual indication of a gestural path for a magnetometer calibration method in accordance with a further embodiment of the present disclosure.

FIG. 23 illustrates a further example of a user interface screen 560 of the calibration application. The visual indication comprises a track 570 and an object (not shown) moveable within the track 570 in response to changes in the orientation of the mobile device 10. The object is typically a flowing liquid but may be a ball. For convenience, the object in FIG. 23 will be referred to as a liquid. The track 570 is generally similar to the track 510 of FIG. 21A-21C except that the track has an additional turn.

Changes in the orientation of the mobile device 10 cause a position of the liquid to move within the track 570. In FIG. 23, the liquid is located at an initial position indicated by the reference 580. Tilting the mobile device 10 in a particular direction causes corresponding movement of the liquid in the particular direction of the tilting. In other examples, the directionality may be reversed so that tilting the mobile device 10 in a particular direction causes corresponding movement of the liquid in a direction opposite to the particular direction of the tilting. Tilting the mobile device 10 left from the initial position 580 causes the liquid to move leftwards along the track 570. When the liquid reaches the leftward end of the track 570, tilting the mobile device 10 up causes the liquid to move towards the top of the track 570. When the liquid reaches the top of the track 570, tilting the mobile device 10 upwards causes the liquid to move towards the bottom of the track 570. When the liquid reaches the bottom of the track 570, tilting the mobile device 10 rightwards causes the liquid to move towards the right of the track 570. The end of the track 570 is indicated by the reference 585. It will be appreciated that the gestural path provided by the user interface screen 500 is performed in a particular order to move the object through the track 570.

FIGS. 24A-24E illustrate yet a further example of a user interface screen 600 of the calibration application. The visual indication comprises a figure or image (not shown), a reticule 610 which overlays the image, and a target 620 which overlays the image. In the shown example, the reticule 610 takes the appearance of cross-hairs although other reticules may be used in other embodiments. In at least some examples, the reticule 610 has a fixed position relative to the display 34 and the target 620 has a fixed position relative to the image. The image may be provided by a camera (not shown) of the mobile device 10 and reticule 610 is the reticule of the camera. Changes in the orientation of the mobile device 10 cause a position of the reticule 610 to move relative to the target 620. An arrow is used in FIGS. 24A-24D to show the direction of movement of the reticule 610 for purposes of illustration. The arrow typically does not form part of the user interface screen 600, but could be provided in the user interface screen 600 if desired.

Tilting the mobile device 10 in a particular direction causes corresponding movement of the reticule in the particular direction of the tilting. For example, tilting the mobile device 10 down causes the reticule 610 to move down, tilting the mobile device 10 upwards causes the reticule 610 to move up, tilting the mobile device 10 right causes the reticule 610 to move right, and tilting the mobile device 10 left causes the reticule 610 to move left. In FIG. 24A, a target 620 is located towards a bottom of the user interface screen 600 below an initial position of reticule 610. Tilting the mobile device 10 downwards causes the reticule to move down towards the target 620. In FIG. 24B, the target 620 is located towards a top of the user interface screen 600 above an initial position of reticule 610. Tilting the mobile device 10 up causes the reticule to move up towards the target. In FIG. 24C, the target 620 is located towards a right of the user interface screen 600 right of an initial position of reticule 610. Tilting the mobile device 10 right causes the reticule to move rightwards towards the target 620. In FIG. 24D, the target 620 is located towards a left of the user interface screen 600 left of an initial position of reticule 610. Tilting the mobile device 10 left causes the reticule to move left towards the target.

Figure 24E:
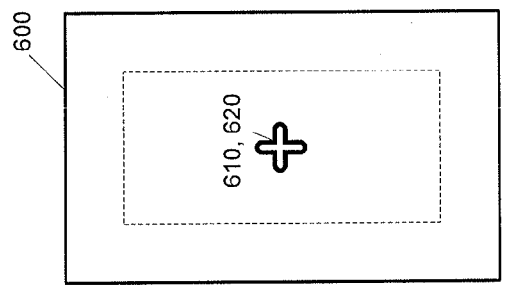
FIGS. 24A-24E are screen shots of example user interfaces comprising a visual indication of a gestural path for a magnetometer calibration method in accordance with yet a further embodiment of the present disclosure.
Figure 24D:
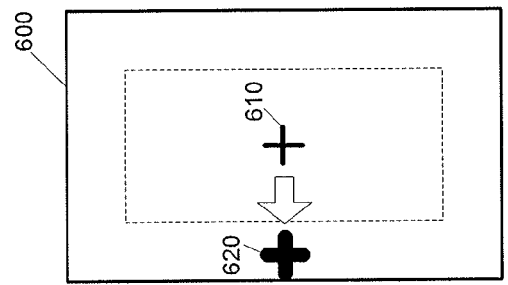
Figure 24C:
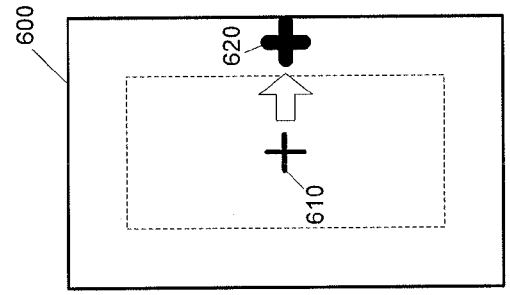
Figure 24B:
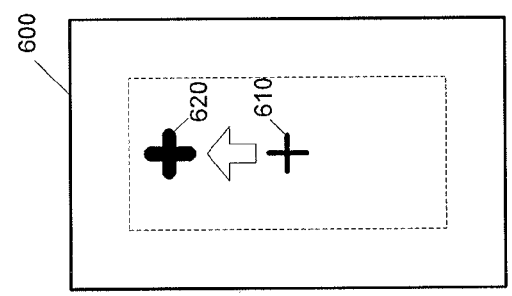
Figure 24A:
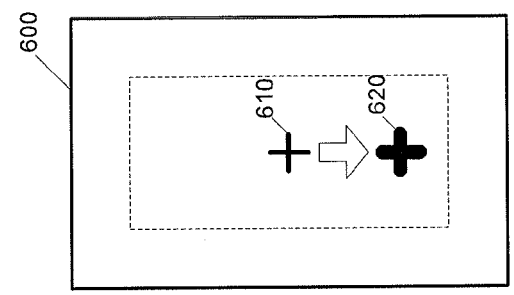

When reticule 610 reaches the target 620 (i.e., when the position of the reticule 610 matches a position of the target 620), as shown in FIG. 24E, the appearance of the reticule 610 and/or target 620 may change to indicate that part of the gestural path has been completed. For example, the colour and/or size of the reticule 610 and/or target 620 may change. In other examples, the directionality may be reversed so that tilting the mobile device 10 in a particular direction causes corresponding movement of the reticule in a direction opposite to the particular direction of the tilting. It will be appreciated that the gestural path provided by the user interface screen 600 may be performed in any order to move the reticule 610 through the target 620 in its various positions.

At 404, the mobile device 10 monitors for changes in orientation of the mobile device 10. Changes in orientation are determined using measurements taken with the orientation sensor 25, such as a three-axis accelerometer. The processor 102, or controller (not shown) of the three-axis accelerometer, converts acceleration measurements into device orientations.

At 406, the visual indication is changed in response to changes in the orientation of the mobile device 10. In the shown examples described above, example, the ball or liquid is moved around the track, or the reticule is moved relative to the target. In at least some examples, the visual indication only changes in response to changes in the orientation of the mobile device 10 which match the gestural path. This encourages users to perform the series of gestures in a particular order which, for example, has been predefined to facilitate learning of the calibration gestures. For example, when the visual indication is a track with a moveable ball or liquid, the ball or liquid only moves in response to changes in the orientation of the mobile device 10 which match the gestural path. Changes which do not match the gestural path of the particular track(s) do not cause changes in the location of the ball or liquid. When the visual indication is an image with a reticule and target, the reticule only moves in response to changes in the orientation of the mobile device 10 which match the gestural path. Changes which do not match the gestural path of the particular track(s) do not cause changes in the location of the reticule.

At 408, a magnetic field is measured with the magnetometer 24. The magnetic field is measured in at least some of the plurality of orientations of the gestural path. In some examples, the magnetic field is measured at all of the plurality of orientations of the gestural path.

At 410, the magnetometer 24 is calibrated in accordance with measurements of the magnetic field acquired at different points along the gestural path. In some examples, the calibrating is performed when a threshold number of measurements of the magnetic field at predetermined points along the gestural path have been measured. The predetermined points along the gestural path typically correspond to orientations of the mobile device 10 used for performing a valid calibration operation. The number of measurements may be controlled by controlling the speed at which the gesture defined by the gestural path is performed so that a sufficient amount of reading/measurements for calibration are taken.

In some examples, the visual indication changes at a rate proportional to a sampling rate of the magnetometer 24 to control the speed at which the gesture defined by the gestural path is performed. For example, when the visual indication is an image with a reticule and target, the reticule 610 may move at a speed proportional to a sampling rate of the magnetometer 24. When the visual indication is a track with a moveable object (e.g., ball or liquid), the object may move at a speed proportional to a sampling rate of the magnetometer 24. In other examples, the speed at which the gesture is performed does not affect the rate of change of the visual indication.

In at least some examples, calibrating comprises performing a calibration operation to obtain one or more calibration parameters and store the obtained calibration parameters. After calibration, the normal magnetometer operations resume. The mobile device 10 may measure the magnetic field with the magnetometer 24 and adjust the measurements of magnetic field in accordance with the stored calibration parameters as part of the normal magnetometer operations.

The user interface screens 500, 530, 560 and 600 provide a visual indication of the gestural path which is relatively easy for users to understand, thereby providing effective visual affordance. The visual indication also enables a relatively fast and consistent calibration, as well as ensuring that a suitable range of data for calibrating the magnetometer 24 is obtained by ensuring that the mobile device 10 is rotated through the x, y and z-planes. The gestural path encourages the user to rotate the mobile device 10 through the x, y and z-planes.

After performing the gesture defined by the gestural path a number of times, users may become familiar enough with the gesture that the gesture may be performed without the aid of the visual indication. This may expedite the calibration procedure. When the user has sufficiently completed enough iterations of the gesture path, the visual indication of the calibration application may be disabled during future calibrations so that a simple prompt similar to that shown in FIG. 10 may be provided.

The steps or operations in the flow charts and diagrams described herein are just for purposes of example. There may be many variations to these steps or operations without departing from the spirit of the present disclosure. For instance, the steps may be performed in a differing order, or steps may be added, deleted, or modified.

While the present disclosure is described, at least in part, in terms of methods, a person of ordinary skill in the art will understand that the present disclosure is also directed to the various components for performing at least some of the aspects and features of the described methods, be it by way of hardware components, software or any combination of the two, or in any other manner. Moreover, the present disclosure is also directed to a pre-recorded storage device or other similar computer readable medium including program instructions stored thereon for performing the methods described herein.

The present disclosure may be embodied in other specific forms without departing from its spirit or essential characteristics. The described example embodiments are to be considered in all respects as being only illustrative and not restrictive. The present disclosure intends to cover and embrace all suitable changes in technology. The scope of the present disclosure is, therefore, described by the appended claims rather than by the foregoing description. All changes that come within the meaning and range of equivalency of the claims are intended to be embraced within their scope.

The invention claimed is:

1. A method of calibrating a magnetometer of a portable electronic device, the method comprising:
    displaying a visual indication of a gestural path on a display of the portable electronic device, wherein the visual indication comprises a reticle and a target, wherein changes in the orientation of the portable electronic device cause a position of the reticle to move relative to the target;
    monitoring for changes in orientation of the portable electronic device;
    changing the visual indication in response to the monitored changes in the orientation of the portable electronic device;
    measuring a magnetic field with the magnetometer; and
    calibrating the magnetometer in accordance with measurements of the magnetic field acquired at different points along the gestural path.

2. The method of claim 1 further comprising moving the portable electronic device along the gestural path.

3. The method of claim 1 wherein the gestural path represents a plurality of orientations of the portable electronic device, wherein the magnetic field is measured in at least some of the plurality of orientations of the gestural path.

4. The method of claim 3 wherein the magnetic field is measured at all of the plurality of orientations of the gestural path.

5. The method of claim 3 wherein the plurality of orientations of the gestural path correspond to a series of gestures in the orientation of the portable electronic device, wherein the series of gestures includes a tilt left, tilt up, tilt down and tilt right.

6. The method of claim 1 wherein the visual indication only changes in response to changes in the orientation of the portable electronic device which match the gestural path.

7. The method of claim 1 wherein the calibrating is performed when a threshold number of measurements of the magnetic field at predetermined points along the gestural path have been measured.

8. The method of claim 1 wherein the calibrating comprises performing a calibration operation to obtain one or more calibration parameters and storing the obtained calibration parameters.

9. The method of claim 8 further comprising measuring the magnetic field with the magnetometer and adjusting the measurements of magnetic field in accordance with the stored calibration parameters.

10. The method of claim 1 wherein the reticle has a fixed position relative to the display and the target has a fixed position relative to a user interface screen displayed on the display.

11. The method of claim 1 wherein the reticle changes in appearance when the position of the reticle matches a position of the target.

12. The method of claim 1 wherein the reticle and target overlay an image provided by a camera of the portable electronic device.

13. The method of claim 1 wherein the reticle moves at a speed proportional to a sampling rate of the magnetometer.

14. A method of calibrating a magnetometer of a portable electronic device, the method comprising:
    displaying a visual indication of a gestural path on a display of the portable electronic device, wherein the visual indication comprises a track and an object moveable within the track in response to changes in the orientation of the portable electronic device, wherein changes in the orientation of the portable electronic device cause a position of the object to move within the track;
    monitoring for changes in orientation of the portable electronic device;
    changing the visual indication in response to the monitored changes in the orientation of the portable electronic device;
    measuring a magnetic field with the magnetometer; and
    calibrating the magnetometer in accordance with measurements of the magnetic field acquired at different points along the gestural path.

15. The method of claim 14 wherein the position of the object within the track only changes in response to changes in the orientation of the portable electronic device which match the gestural path.

16. The method of claim 14 wherein the object is a ball.

17. The method of claim 14 wherein the object is a flowing liquid.

18. The method of claim 14 wherein the object moves at a speed proportional to a sampling rate of the magnetometer.

19. A portable electronic device, comprising:

a processor;

a magnetometer coupled to the processor;

a display coupled to the processor;

wherein the processor is configured for: displaying a visual indication of a gestural path on the display, wherein the visual indication comprises a reticule and a target, wherein changes in the orientation of the portable electronic device cause a position of the reticule to move relative to the target; monitoring for changes in orientation of the portable electronic device; changing in the visual indication in response to the monitored changes in the orientation of the portable electronic device; measuring a magnetic field with the magnetometer; and calibrating the magnetometer in accordance with measurements of the magnetic field acquired at different points along the gestural path.

20. A portable electronic device, comprising:

a processor;

a magnetometer coupled to the processor;

a display coupled to the processor;

wherein the processor is configured for: displaying a visual indication of a gestural path on the display, wherein the visual indication comprises a track and an object moveable within the track in response to changes in the orientation of the portable electronic device, wherein changes in the orientation of the portable electronic device cause a position of the object to move within the track; monitoring for changes in orientation of the portable electronic device; changing in the visual indication in response to the monitored changes in the orientation of the portable electronic device; measuring a magnetic field with the magnetometer; and calibrating the magnetometer in accordance with measurements of the magnetic field acquired at different points along the gestural path.

\* \* \* \* \*